United States Patent [19]
Ueyama et al.

[11] Patent Number: 5,916,366
[45] Date of Patent: Jun. 29, 1999

[54] SUBSTRATE SPIN TREATING APPARATUS

[75] Inventors: Tsutomu Ueyama; Akira Izumi; Hideki Adachi, all of Kyoto, Japan

[73] Assignee: Dainippon Screen Mfg. Co., Ltd., Japan

[21] Appl. No.: 08/944,229

[22] Filed: Oct. 6, 1997

[30] Foreign Application Priority Data

| Oct. 8, 1996 | [JP] | Japan | 8-266436 |
| Feb. 7, 1997 | [JP] | Japan | 9-024828 |
| Feb. 7, 1997 | [JP] | Japan | 9-024829 |

[51] Int. Cl.$^6$ ................................. B05C 5/00
[52] U.S. Cl. ................ 118/52; 118/56; 118/319; 118/320; 118/500; 118/503; 134/902; 134/153
[58] Field of Search ................ 118/500, 503, 118/52, 56, 319, 320; 134/902, 153; 414/941, 935; 427/240

[56] References Cited

U.S. PATENT DOCUMENTS

| 4,286,541 | 9/1981 | Blackwood | 118/52 |
| 5,480,484 | 1/1996 | Kelley et al. | 118/52 |

FOREIGN PATENT DOCUMENTS

| 63-153839 | 6/1988 | Japan . | |
| 2197126 | 8/1990 | Japan | 134/902 |
| 2253620 | 10/1990 | Japan | 134/902 |
| 4150027 | 5/1992 | Japan | 134/902 |

Primary Examiner—Laura Edwards
Attorney, Agent, or Firm—Ostrolenk, Faber, Gerb & Soffen, LLP

[57] ABSTRACT

A substrate treating apparatus for performing a predetermined treatment of a substrate in a spin, has a spin motor including a rotor having a hollow opening centrally thereof, and a stator disposed coaxially with the rotor and having a hollow opening centrally thereof. The rotor includes holders for supporting the substrate in three peripheral positions thereof. A support mechanism switches the holders between a position for supporting the substrate, and a position retracted therefrom. The opposite surfaces of the substrate supported by the holders are cleaned with a cleaning solution supplied through nozzles. The holders have a substrate supporting force derived from a weight and magnetism of the support mechanism, to support the substrate reliably. A guide is disposed in the hollow of the rotor, and connected to the rotor. The holders are arranged in a substrate treating space formed inwardly of the guide. The holders are arranged on the guide. Thus, the spin motor is protected from exposure to a treating solution atmosphere.

19 Claims, 12 Drawing Sheets

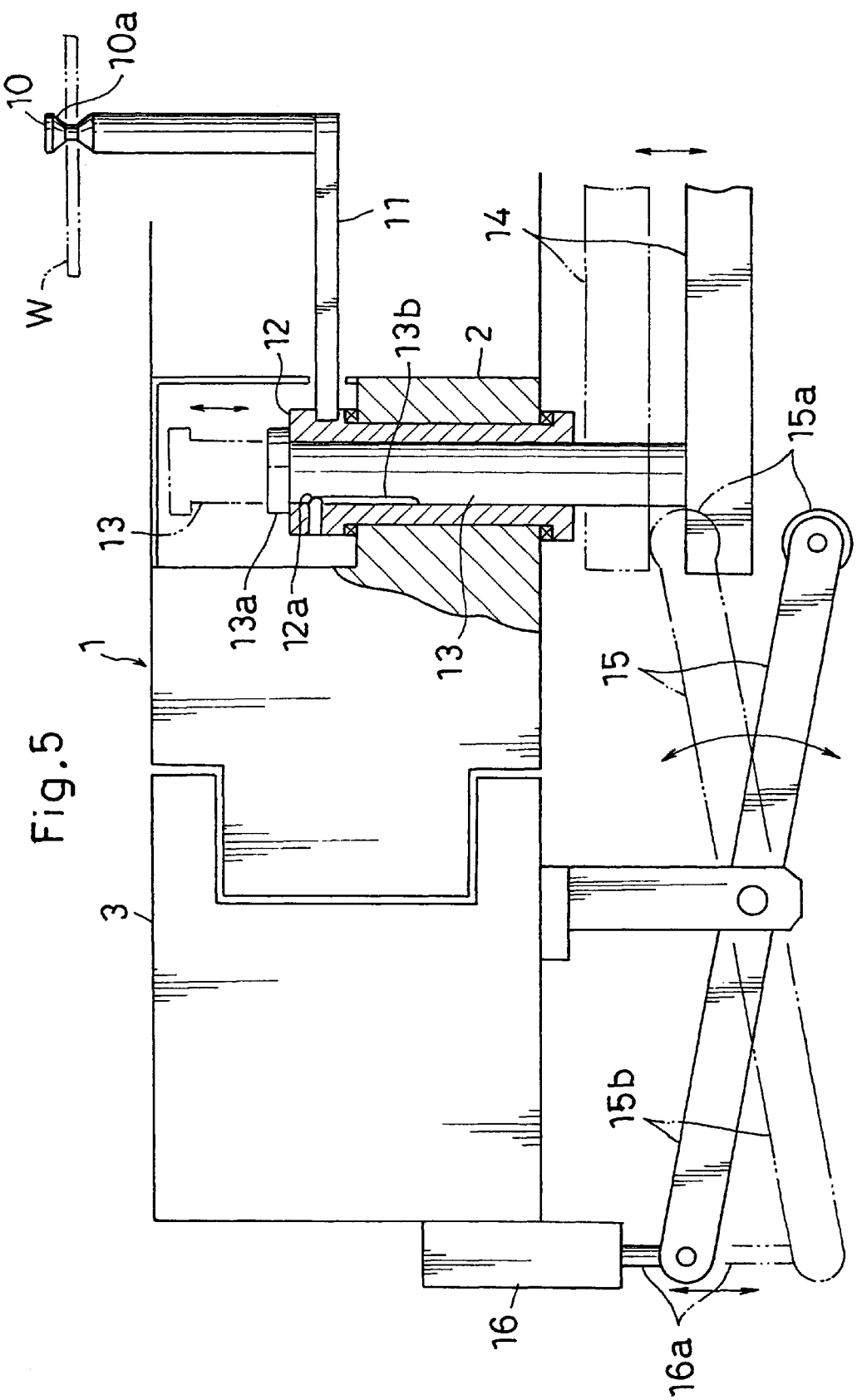

Fig.6A
Fig.6B
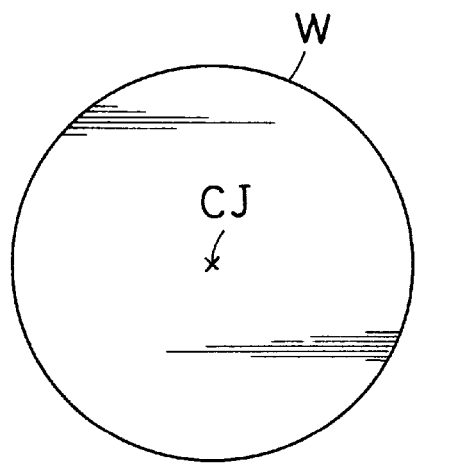
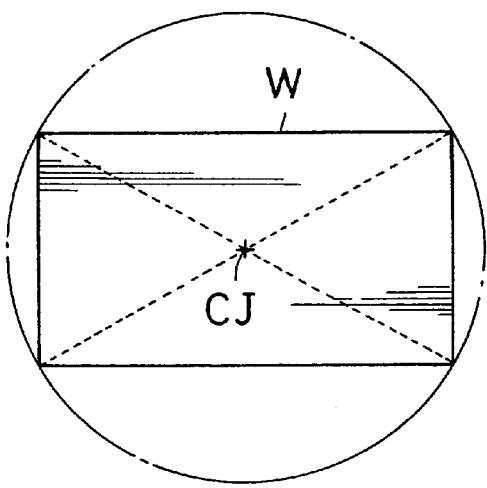
Fig.7
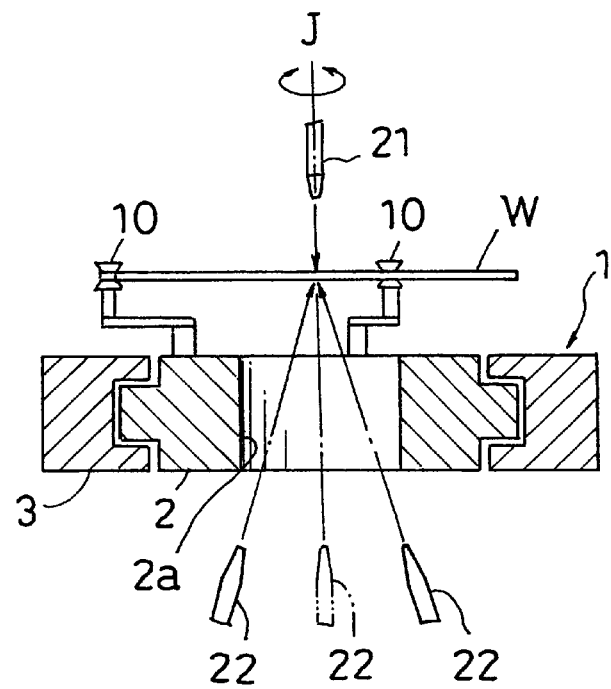

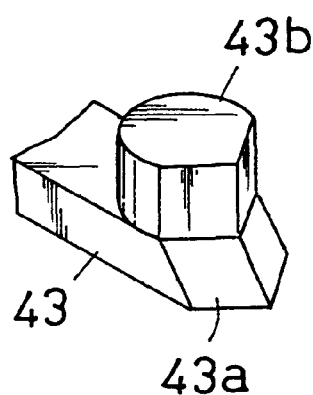
Fig.12A
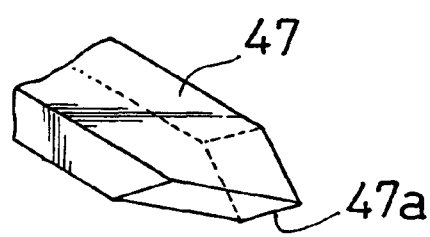
Fig.12B
Fig.12C
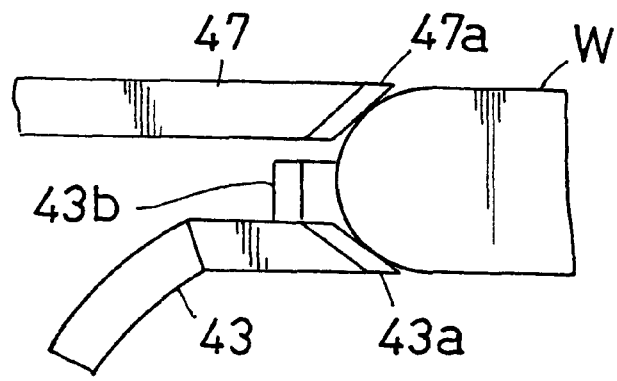
Fig.13
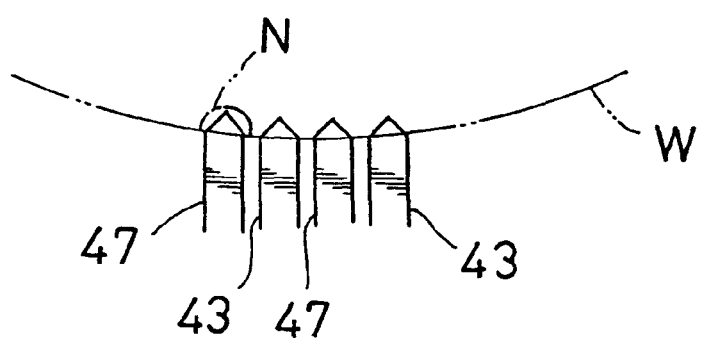

SUBSTRATE SPIN TREATING APPARATUS

BACKGROUND OF THE INVENTION

(1) Field of the Invention

This invention relates to substrate treating apparatus for carrying out a predetermined treatment, such as cleaning or resist coating, of spinning substrate.

(2) Description of the Related Art

A conventional substrate treating apparatus of this type, generally, includes a rotary shaft extending vertically and drivably connected to a motor, and a substrate support mechanism mounted on an upper end the rotary shaft. A known substrate support mechanism has a spin base defining vacuum suction bores for suction-supporting a lower surface (usually a reverse surface) of a substrate. Another known substrate support mechanism has a spin base with three or more substrate supporting pins arranged peripherally thereof for supporting a substrate in three or more peripheral positions of the substrate.

In the conventional apparatus, the torque of the motor is transmitted to the rotary shaft, with a substrate placed on the substrate support mechanism. Thus, the substrate is spun about the axis of the rotary shaft, together with the rotary shaft and substrate support mechanism. In this state, the substrate receives a predetermined treatment such as cleaning or resist coating.

The conventional apparatus has the following drawbacks.

In the conventional apparatus, the motor and rotary shaft are arranged below the substrate and occupy a large space in the vertical direction. Further, the motor and other components below the substrate are obstructive to treatment of the lower surface of the substrate. That is, although the conventional apparatus is capable of treating one surface of the substrate, it is difficult or impossible to treat the opposite surfaces of the substrate.

SUMMARY OF THE INVENTION

This invention has been made having regard to the state of the art noted above, and its object is to provide a substrate treating apparatus which occupies a reduced space in the vertical direction, and which is suited for treating opposite surfaces of a substrate.

The above object is fulfilled, according to this invention, by a substrate treating apparatus for performing a predetermined treatment of a substrate in a spin, comprising:

a spin motor including a rotor having a hollow opening centrally thereof, and a stator disposed coaxially with the rotor and having a hollow opening centrally thereof; and a substrate support device mounted in the rotor for supporting the substrate.

According to this apparatus, the substrate is supported by the substrate support device mounted in the rotor of the spin motor. The rotor is spun relative to the stator disposed coaxially with the rotor, thereby spinning the substrate along with the substrate support device, for performing a predetermined treatment of the substrate.

The rotor of the spin motor has a hollow opening centrally thereof, and the stator also has a hollow opening centrally thereof. Where, for example, the spin motor is constructed with the rotor mounted inside the stator, a hollow (which is the hollow of the rotor) is formed centrally of the spin motor. Where the spin motor is constructed with the stator mounted inside the rotor, a hollow (which is the hollow of the stator) is also formed centrally of the spin motor. That is, the spin motor has a hollow opening centrally thereof.

The substrate support device is mounted in the rotor of the spin motor having a hollow, for supporting a substrate. Thus, the substrate support device does not occupy an additional space in the vertical direction as occupied by the motor and the like in the conventional apparatus. The apparatus according to this invention has reduced vertical dimensions. This is advantageous in stacking a plurality of apparatus in the vertical direction, for example.

Where, for example, the substrate is supported above the spin motor, no obstacle is present below the lower surface (opposed to the spin motor) of the substrate supported by the substrate support device. Since the spin motor has a hollow formed therein, the lower surface of the substrate may be treated through this hollow. Of course, there is no obstacle above the upper surface (facing away from the spin motor) of the substrate supported by the substrate support device. Thus, the upper surface of the substrate may be treated freely. That is, this apparatus is capable of treating the opposite surfaces of the substrate effectively. The opposite surfaces of the substrate may be treated effectively also where the substrate is supported below the spin motor.

This substrate treating apparatus may be used, for example, to clean the opposite surfaces of the substrate effectively.

In the above substrate treating apparatus, the rotor may be supported by the stator through a static pressure gas bearing. This bearing imparts a less frictional resistance than a dynamic pressure bearing when the rotor is spun relative to the stator, to realize a high-speed spin of the rotor. Further, where a chemical solution is used in the treatment of the substrate, the chemical solution could flow into the space between the stator and rotor to corrode the stator and rotor. Where the rotor is supported by the stator through a static pressure gas bearing, the gas supplied to the space between the stator and rotor spouts outside through that space, thereby preventing the chemical solution from flowing into the space.

In the above substrate treating apparatus, the hollow formed centrally of the spin motor may have a size at least corresponding to a circle described by edges remotest from a spin center of the substrate supported by the substrate support device.

The substrate supported by the substrate support device is spun within a turning circle having a radius corresponding to a distance between the spin center of the substrate and edges of the substrate remotest from the spin center. Where the hollow formed centrally of the spin motor is equal in size to, or larger than, this turning circle, the entire surface of the substrate opposed to the spin motor may be treated with facility. Thus, the opposite surfaces of the substrate may be cleaned with brushes, for example.

Where the hollow of the spin motor is larger than the turning circle noted above, the substrate may be supported inside the hollow of the spin motor. Where, for example, the rotor is mounted inside the stator, with the substrate support device extending from inner peripheral surfaces defining the hollow of the rotor toward the center of the hollow of the rotor, the substrate may be supported inside the hollow of the spin motor (rotor). This substrate treating apparatus has a still less height than where the substrate is supported over or under the spin motor. In this construction also, areas over and under the substrate supported inside the hollow of the spin motor are opened to enable treatment of the opposite surfaces of the substrate.

In the above substrate treating apparatus, the spin motor may be constructed with the rotor disposed outside and coaxially with the stator. In this case, generally, the rotor is larger than the stator, and may not receive a sufficient torque for its spin. It is then difficult to achieve a high-speed spin of the rotor (and of the substrate). It is therefore preferred that the stator is disposed outside and coaxially with the rotor.

The substrate support device comprises, for example, holders for holding the substrate in horizontal posture, in a plurality of peripheral positions thereof, and a support mechanism for switching the holders between a holding position for holding the substrate and a retracted position away from the substrate.

In the above construction, the support mechanism, preferably, generates a substrate holding force based on a weight and magnetism of components thereof.

With this construction, the components of the support mechanism arranged around the substrate are forcibly displaced to move the holders to the retracted position away from the edges of the substrate. In this state, the substrate is transported to a predetermined position in horizontal posture. Next, the forcible displacement of the components is canceled to allow the holders to assume the holding position. The holders support the substrate in a plurality of peripheral positions thereof with a substrate holding force derived from the magnetism as well as weight of the components.

With the substrate holding force derived as described above, no metallic parts such as springs are required for maintaining the holders in the holding position, nor is a link mechanism for interlocking the holders to the springs disI,F posed remote therefrom. Thus, the substrate may be supported by a simple construction. The simple construction facilitates maintenance operations such as cleaning and inspection. The substrate holding force is strong since it is derived from the magnetism as well as weight of the components of the support mechanism. The substrate supported will never be released during a high speed spin to receive the predetermined treatment.

The holders may include lower lugs for contacting edges of the substrate from below, and upper lugs for contacting the edges of the substrate from above, at least one of a proximal end of each of the lower lugs and a proximal end of each of the upper lugs being connected to the rotor, the support mechanism being operable to move the lower lugs and the upper lugs away from each other to assume the retracted position, and close to each other to assume the holding position.

In the above construction, the support mechanism, preferably, is operable to move the lower lugs and the upper lugs close to each other by a weight and magnetism of components of the support mechanism.

According to this construction, the components of the support mechanism are forcibly displaced to separate the lower lugs and upper lugs acting as the holders to assume the retracted position. In this state, the substrate is transported to the predetermined position in horizontal posture. Next, the forcible displacement of the components is canceled to allow the lower lugs and upper lugs approach each other to assume the holding position. In this state, the weight and magnetism of the components of the support mechanism impart forces to move the lower lugs and upper lugs toward each other, thereby to hold the edges of the substrate.

Since at least one of the proximal end of each of the lower lugs and the proximal end of each of the upper lugs is connected to the rotor of the spin motor, the substrate supported by the lower lugs and upper lugs spins with the rotor. The weight and magnetism of the components of the support mechanism impart forces to move the lower lugs and upper lugs toward each other. Therefore, even where only one of the proximal end of each of the lower lugs and the proximal end of each of the upper lugs is connected to the rotor, the lugs not connected to the rotor (i.e. driven lugs) are revolvable with the lugs connected to the rotor (i.e. drive lugs).

The construction may be greatly simplified where, as described above, the lower lugs and upper lugs are movable toward and away from each other to switch between the holding position and retracted position.

Preferably, the proximal end of each of the lower lugs and the proximal end of each of the upper lugs have substrate holding magnets, the substrate holding magnets, in the holding position, imparting attractive forces and/or repulsive forces to move the lower lugs and the upper lugs close to each other. Then, the magnetism for moving the lower lugs and the upper lugs toward each other is derived directly from a relatively simple construction. The magnetism for moving the lower lugs and the upper lugs in the holding position toward each other may include forces other than attractive forces and/or repulsive forces of the substrate holding magnets provided for the proximal ends of the lower lugs and upper lugs.

The proximal end of each of the lower lugs may have a recess and/or a projection, and the proximal end of each of the upper lugs has a projection and/or a recess for engaging the recess and/or the projection of the proximal end of each of the lower lugs in the holding position.

Where only one of the proximal end of each of the lower lugs and the proximal end of each of the upper lugs is connected to the rotor of the spin motor, a discrepancy in speed may occur between the drive lugs and driven lugs in the event of a strong force of inertia resulting from an acceleration or deceleration the rotating spin motor, although the force is operative for moving the lower and upper lugs toward each other. Then, the lower and upper lugs could rub against the edges of the substrate held by these lugs. However, where the proximal ends of the lower lugs and those of the upper lugs are engaged as noted above, the lower lugs and upper lugs always revolve together. This construction suppresses the discrepancy in speed between the drive lugs and driven lugs due to inertia occurring in time of acceleration or deceleration of the spin. This checks generation of particles due to the lower and upper lugs rubbing against the edges of the substrate supported by the lugs, to reduce the possibility of substrate contamination.

The recesses and the projections engageable in the holding position may be in a vertical position, and may be loosely engageable. Then, the recess and projection forming a pair may be engaged, with the inner peripheral surface of the recess remaining out of contact with the outer peripheral surface of the projection. The recesses may have recess magnets arranged on the inner peripheral surfaces thereof, and the projections may have projection magnets arranged on the outer peripheral surfaces thereof, such that, when the recesses and the projections are loosely engaged, the inner peripheral surfaces of the recesses and the outer peripheral surfaces of the projections repulse each other. With this construction, the repulsive forces of the magnets prevent the inner peripheral surfaces of the recesses and the outer peripheral surfaces of the projection from becoming displaced in a direction to contact each other, as a result of a discrepancy in speed between the drive lugs and driven lugs due to inertia occurring in time of acceleration or deceleration of the rotating spin motor. The inner peripheral surfaces of the recesses and the outer peripheral surfaces of the projections are thereby maintained out of contact with each other. Thus, the recess and projection forming a pair may be engaged, with the peripheral surfaces thereof constantly remaining out of contact with each other. In this way, particle generation due to an abrasion between the components may be suppressed to reduce the possibility of substrate contamination still further.

A plurality of upper lugs and a plurality of lower lugs may be juxtaposed for supporting the substrate in each peripheral position. When supporting a notched substrate, the notch may register with one of the lower lugs and upper lugs. Even so, the other lugs vertically grip the substrate. Thus, the notched substrate may also be supported reliably.

Each of the upper lugs and each of the lower lugs may have edged distal ends, respectively. Then, the lugs contact the substrate in diminished areas thereof to reduce the possibility of contaminating the substrate. In addition, the treating solution may be purged effectively from where the lugs hold the edges of the substrate, to enable the substrate to be treated with high precision.

The substrate treating apparatus may further comprise a treating solution supply device for supplying a treating solution to the substrate supported by the substrate support device, and a guide device for receiving splashes of the treating solution scattering from the substrate during treatment, and guiding the treating solution to a waste liquid outlet; the holders including lower lugs for contacting edges of the substrate from below, and upper lugs for contacting the edges of the substrate from above; the support mechanism being operable to move the lower lugs and the upper lugs away from each other to assume the retracted position, and close to each other to assume the holding position; the guide device being disposed in a hollow of the spin motor and connected to the rotor; the lower lugs and the upper lugs being arranged in a substrate treating space formed inwardly of the guide device, and the lower lugs and the upper lugs being arranged on the guide device.

In this construction, the substrate is supported by the lower lugs and upper lugs arranged in the substrate treating space formed inwardly of the guide device, and attached to the guide device. The guide device is mounted in the hollow of the spin motor, and connected to the rotor of the spin motor. When the rotor is spun about a vertical axis relative to the stator, the guide device is spun with the rotor about the vertical axis. The substrate supported by the lower lugs and upper lugs is spun with the guide device about the vertical axis. The predetermined treatment is performed with the treating solution supplied to the substrate supported and spun about the vertical axis. Splashes of the treating solution scattering from the edges of the substrate during the treatment is received and guided to the waste liquid outlet by the guide device. The spin motor is disposed outside the guide device and isolated from the substrate treating space. Thus, the spin motor is protected from the atmosphere of the treating solution.

The guide device may include a lower guide member and an upper guide member, the lower lugs being arranged on the lower guide member, and the upper lugs being arranged on the upper guide member; one of the lower guide member and the upper guide member being connected to the rotor; and the other guide member being vertically movable toward and away from the one guide member connected to the rotor; the lower lugs and the upper lugs holding the substrate in peripheral positions thereof above an upper end or below a lower end of the one guide member connected to the rotor.

In this construction, the substrate is supported by the lower lugs and upper lugs arranged on the lower and upper guide members moved close to each other. The spin motor is operated to spin the substrate supported. The treating solution is supplied to effect the predetermined substrate treatment. When the lower guide member and upper guide member are moved away from each other, the lower lugs and upper lugs are separated to release the substrate. Where the lower guide member is connected to the rotor, the substrate may be supported by the lower lugs and upper lugs above the upper end of the lower guide member. Then, this support position is in a space between the upper end of the lower guide member and the lower of the upper guide member separated from each other. Through the space between the upper end of the lower guide member and the lower end of the upper guide member, a substrate transport arm of a substrate transport mechanism may advance and retract laterally of the apparatus to transport the substrate into and out of the apparatus, and place and remove the substrate on/from the holders. Where the upper guide member is connected to the rotor, the substrate may be supported by the lower lugs and upper lugs below the lower end of the upper guide member. Then, through the space between the upper end of the lower guide member and the lower end of the upper guide member, the substrate transport arm may advance and retract laterally of the apparatus to transport the substrate into and out of the apparatus, and place and remove the substrate on/from the holders.

Generally, the substrate is transported into and out of this type of substrate treating apparatus, and placed on and removed from the holders, by laterally advancing and retracting the substrate transport arm of the substrate transport mechanism. Thus, the substrate transport mechanism commonly used in the prior art may be employed in transporting the substrate into and out of the apparatus, and placing and removing the substrate on/from the holders.

The upper guide member may have a lower end thereof extending circumferentially of the lower lugs when the lower guide member and the upper guide member are placed adjacent each other. Then, when the lower lugs revolve in the substrate treating space, cutting through the gas therein, the upper guide member suppresses disturbance of the gas to avoid the disturbance of the gas affecting the substrate treatment.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIGS. 4A, 4B and 5 are views showing a mechanism for causing holders to support and release a substrate;

FIGS. 6A and 6B are explanatory views of turning circles described by spinning substrates;

FIG. 7 is view showing a modification in which a spin motor has a hollow of reduced size;

FIGS. 12A, 12B and 12C are perspective views and a front view of a lower lug and an upper lug;

FIG. 13 is a fragmentary plan view of a modification in which a plurality of lower lugs and upper lugs are provided for each supporting position;

DESCRIPTION OF THE PREFERRED EMBODIMENTS

Preferred embodiments of this invention will be described in detail hereinafter with reference to the drawings.

The following embodiments exemplify a substrate cleaning apparatus for cleaning substrates (e.g. semiconductor wafers).

First Embodiment

Figure 1:
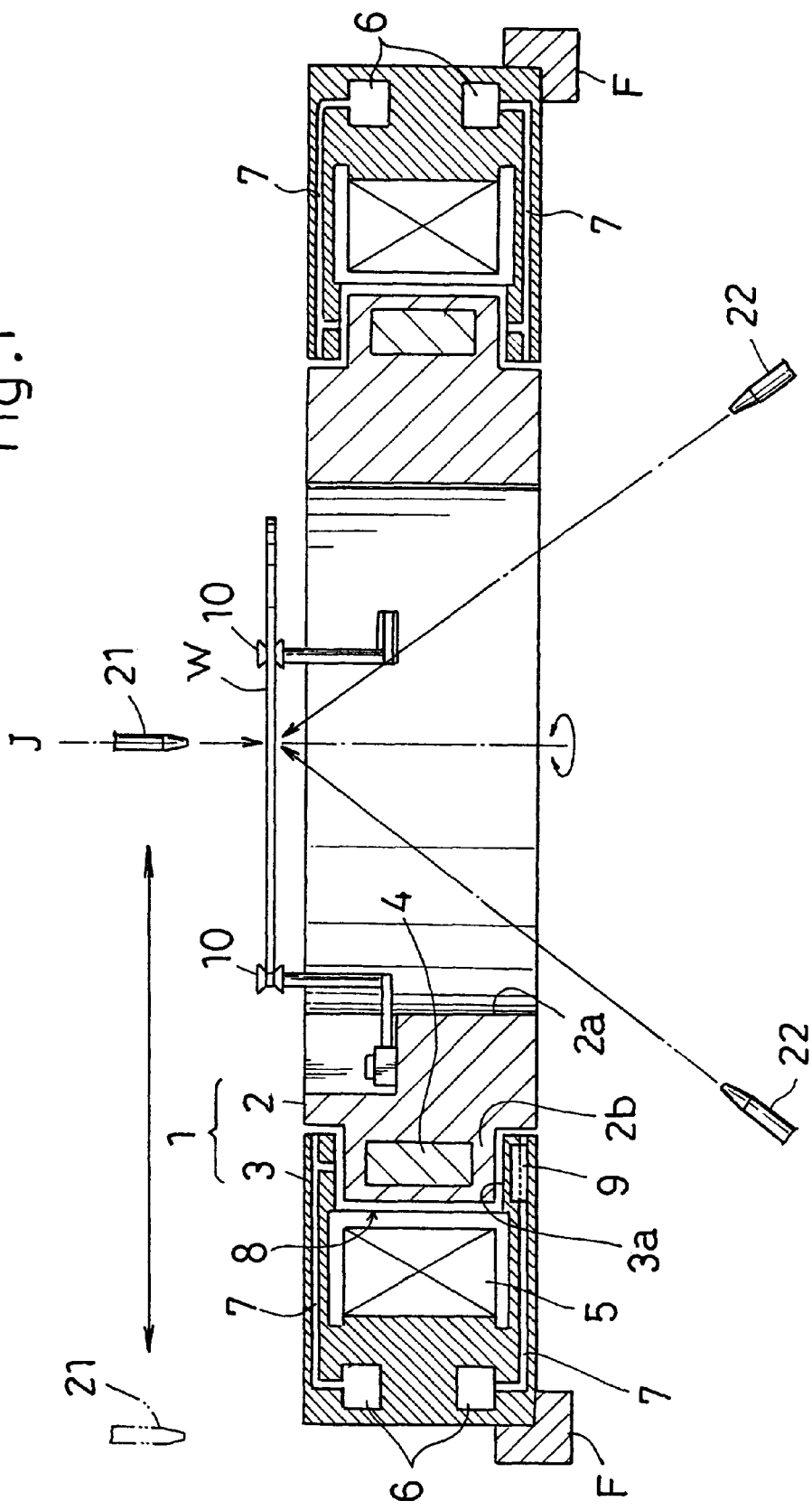
FIG. 1 is a view in vertical section of a substrate treating apparatus in a first embodiment of this invention.
Figure 2:
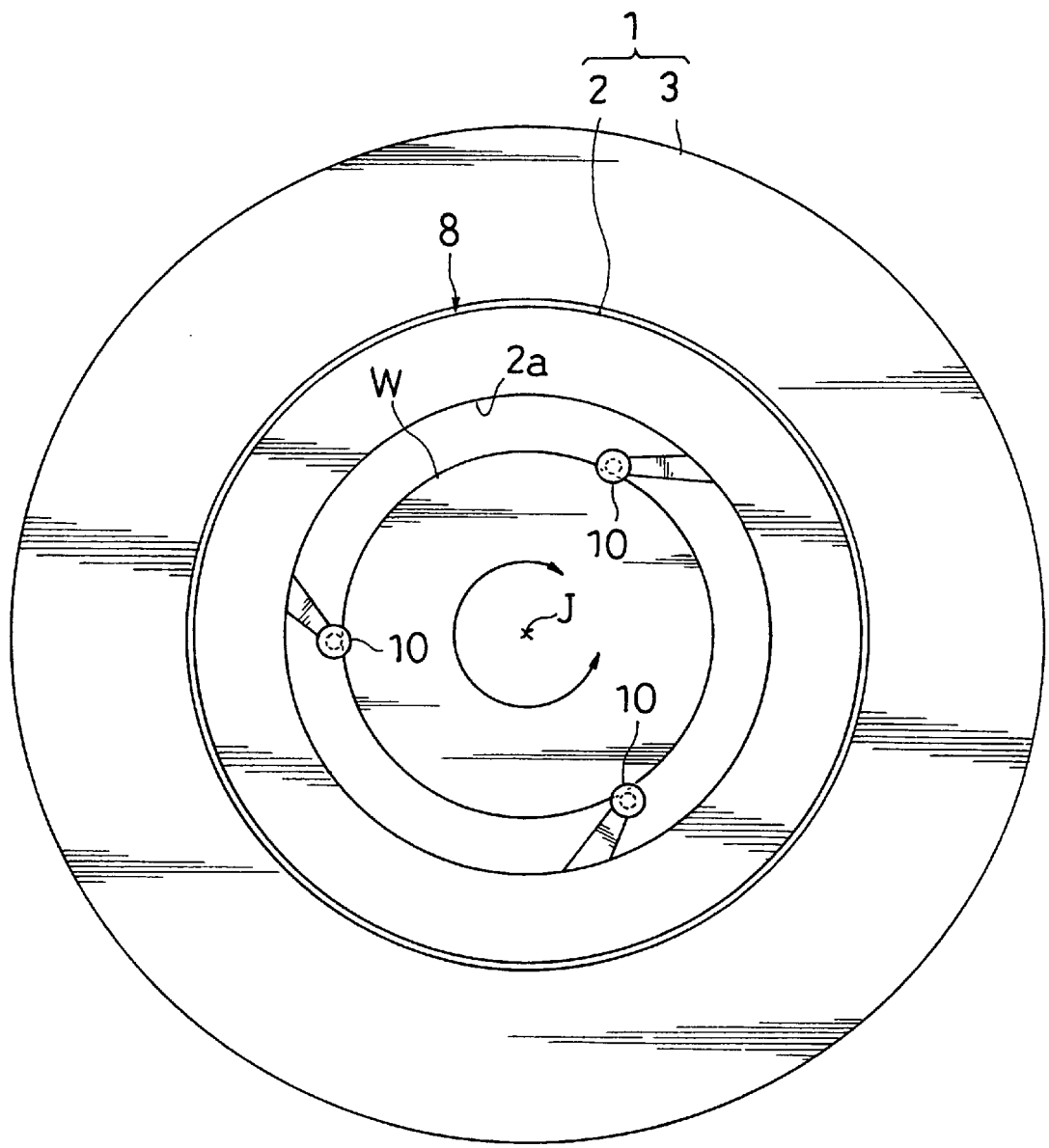
FIG. 2 is a plan view of the apparatus in the first embodiment.

As shown in FIGS. 1 and 2, a spin motor 1 for spinning a wafer W supported in horizontal posture includes a ring-shaped rotor 2 having a hollow 2a formed centrally thereof, and a ring-shaped stator 3 having a hollow formed centrally thereof and disposed coaxially with the rotor 2 to surround the rotor 2 (i.e. to enclose the rotor 2 and the hollow 2a formed therein). The stator 3 is supported by an apparatus frame F. The rotor 2 includes an annular projection 2b formed on an outer peripheral surface thereof. On the other hand, the stator 3 includes an annular recess 3a formed in an inner peripheral surface thereof. The rotor 2 further includes permanent magnets 4 embedded and arranged in ring form in the projection 2b. The stator 3 includes coils 5 arranged in ring form and opposed to the permanent magnets 4.

Figure 3A:
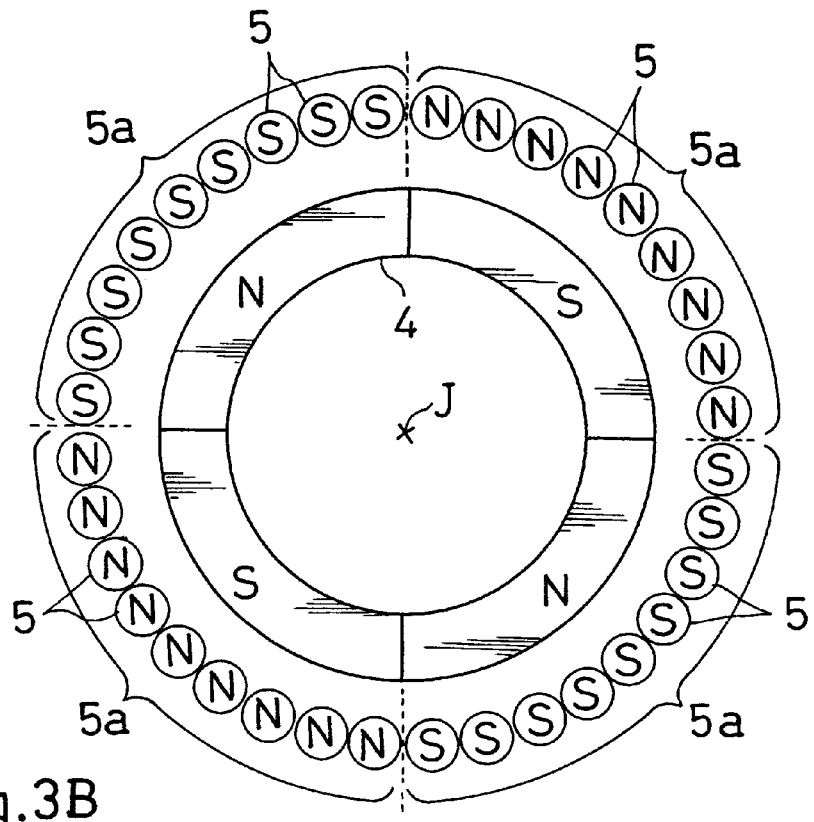
FIGS. 3A and 3B are views showing permanent magnets embedded in a rotor, and coils embedded in a stator.
Figure 3B:
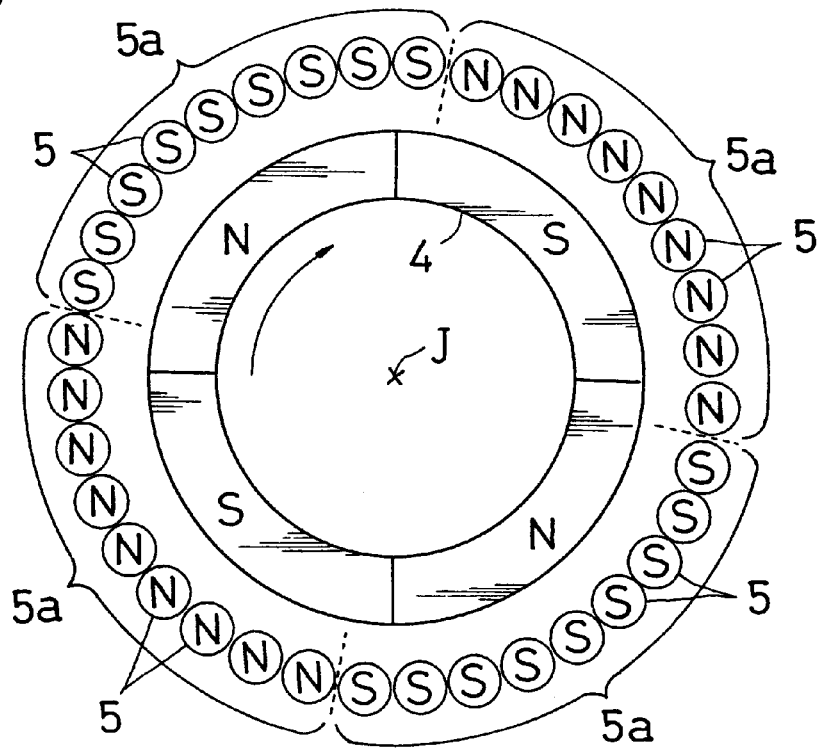

The permanent magnets 4 and coils 5 are arranged as shown in FIG. 3A, for example. The permanent magnets 4 are arranged in ring form, with the polarity reversed every predetermined angle (which is 90° in FIG. 3A) about a spin center J. A plurality of coils 5 are arranged around the permanent magnets 4. Each coil 5 has a polarity which is reversible by switching the direction of current. The coils 5 are grouped into a plurality of (four in FIG. 3A) coil blocks 5a forming predetermined angular ranges (90° ranges in FIG. 3A) about the spin center J. Each coil block 5a is controllable independently of the other. The coils 5 constituting each coil block 5a have the same polarity with currents flowing in the same direction. Each coil block 5a has a polarity which is reversed from that of adjacent coil blocks 5a. As shown in FIG. 3B, for example, the polarity of coils 5 is successively switched clockwise, thereby to revolve the permanent magnets 4 clockwise. Conversely, the polarity of coils 5 may be successively switched counterclockwise, thereby to revolve the permanent magnets 4 counterclockwise. By controlling the coils 5 in this way, the rotor 2 may be rotated about the spin center J relative to the stator 3.

As noted hereinbefore, the spin motor 1 includes the ring-shaped rotor 2 having the hollow 2a formed centrally thereof, and the ring-shaped stator 3 having the hollow formed centrally thereof and disposed coaxially with the rotor 2. Thus, a hollow (i.e. the hollow 2a of the rotor) is formed centrally of the spin motor 1.

The stator 3 includes gas buffers 6 communicating with a supply source (not shown) of a gas such as air or an inert gas (e.g. nitrogen gas). The gas is supplied from the gas buffers 6 through gas supply passages 7 to a space 8 between the rotor 2 and stator 3. Thus, the rotor 3 is supported by the stator 3 through a static pressure gas bearing.

The rotor 2 may be supported by the stator 3 through a dynamic pressure bearing such as mechanical bearings. However, the dynamic pressure bearing imparts a stronger frictional resistance than the static pressure gas bearing when the rotor 2 is spun relative to the stator 3, to make a high-speed spin difficult to achieve. Further, where a chemical solution is used in the treatment of wafer W, the chemical solution may flow into the space 8 between the stator 3 and rotor 2. In the case of a dynamic pressure bearing, a chemical resistance treatment must be provided for mechanical bearings arranged in the space 8. This poses a troublesome manufacturing step. The static pressure gas bearing requires no mechanical bearings, and the gas supplied to the space 8 spouts outside, thereby preventing the chemical solution from flowing into the space 8. Thus, where the wafer W is spun at high speed or a chemical solution is used in treating the wafer W, the static pressure gas bearing has advantages over the dynamic pressure bearing in acting as a bearing between the rotor 2 to stator 3.

The stator 3 further includes a Hall element 9 mounted therein and opposed to lower surfaces of the permanent magnets 4. The Hall element 9 is capable of determining a strength and polarity of magnetic lines of force. The positions of permanent magnets 4 may be detected based on output voltages of Hall element 9. The Hall element 9 may be used as a position sensor for stopping the spinning rotor 2 at a predetermined position. A plurality of Hall elements 9 may be arranged for stopping the spinning rotor 2 at the plurality of positions.

The rotor 2 includes three or more (three in the drawings) holders 10. The holders 10 support the wafer W in three or more peripheral positions thereof. In this state, the rotor 2 is spun relative to the stator 3, thereby spinning the wafer W about the spin center J.

The holders 10 are movable between a position for holding the wafer W and a position for releasing the wafer W. This movement may be achieved by a construction as shown in FIGS. 4A, 4B and 5, for example.

Each holder 10 has a proximal end thereof connected to a distal end of a swing arm 11. The swing arm 11 is movable between a position shown in solid lines and a position shown in two-dot-and-dash lines in FIG. 4A, to switch the holder 10 between the position for holding the wafer W and the position for releasing the wafer W. That is, in the position shown in the solid lines, constrictions 10a at the distal ends of the respective holders 10 support the wafer W in three peripheral positions thereof. In the position shown in the two-dot-and-dash lines, the holders 10 are retracted from the wafer W to release the wafer W.

Each swing arm 11 is swung by the following construction.

Figure 4A:
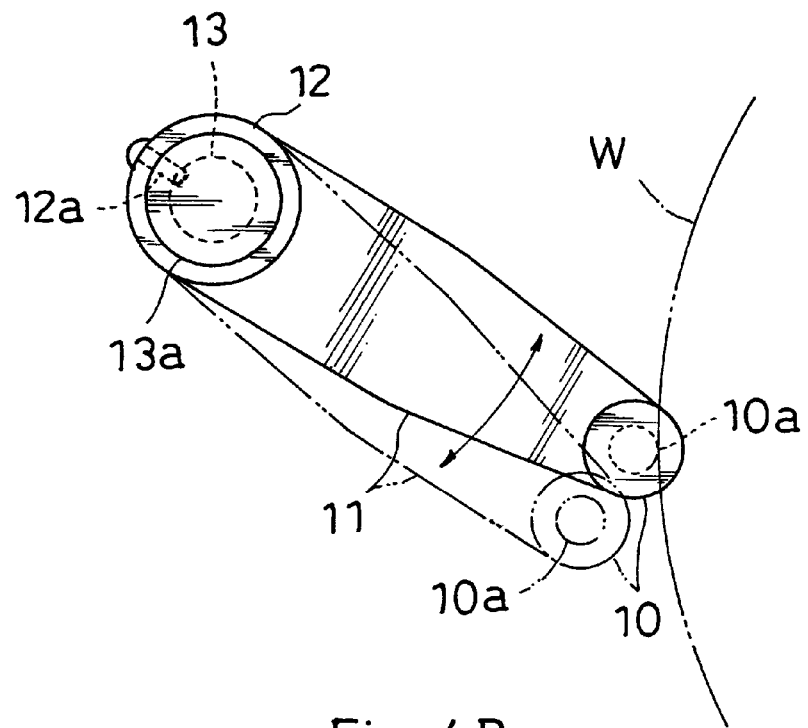
Figure 4B:
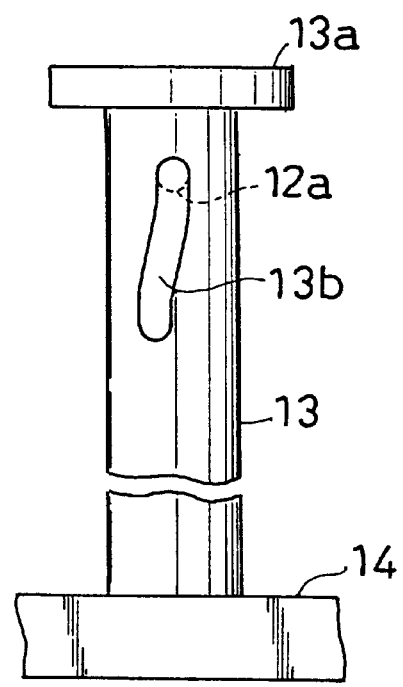

As shown in FIGS. 4A and 5, each swing arm 11 is connected at a proximal end thereof to a cylindrical member 12. The cylindrical member 12 is rotatably supported by the rotor 2. A core element 13 is vertically movably fitted in the hollow of cylindrical member 12. The core element 13 has a stopper 13a formed at an upper end thereof for limiting its descent. The core element 13 has a lower end thereof fixed to a common ring 14. All core elements 13 are vertically movable together with vertical movement of the ring 14. A distal end 15a of a swing member 15 is disposed below the ring 14. The proximal end 15b of swing member 15 is connected to a distal end of a rod 16a of an air cylinder 16. The proximal end 15b of swing member 15 is movable up and down with contraction and extension of the rod 16a of air cylinder 16. As a result, the distal end 15a of swing member 15 is lowered and raised in a seesaw motion. When the distal end 15a of swing member 15 is lowered, as shown in solid lines in FIG. 5, each core element 13 is lowered relative to the cylindrical member 12 by the weight of ring 14 and core elements 13. When the distal end 15a of swing member 15 is raised, the ring 14 is hoisted by the distal end 15a of swing member 15, whereby all core elements 13 are raised together relative to the cylindrical members 12.

Each core element 13 defines a grooved cam 13b as shown in FIG. 4B. As shown in FIG. 5, each cylindrical member 12 includes a pin 12a projecting inside. This pin 12a is engaged in the grooved cam 13b of core element 13. When the rod 16a of air cylinder 16 is contracted to lower the core elements 13 relative to the cylindrical members 12, the holders 10 support the wafer W in three peripheral positions thereof as shown in the solid lines in FIGS. 4A and 5. When the rod 16a of air cylinder 16 is extended to raise the core elements 13 relative to the cylindrical members 12, the pins 12a of cylindrical member 12 move along the grooved cams 13b of core elements 13, respectively. As a result, the cylindrical members 12 are rotated about vertical axes relative to the core elements 13, thereby swinging the swing arms 11 away from the wafer W as shown in the two-dot-and-dash lines in FIG. 4A. The core element 13 is fixed to the ring 14, only to be vertically movable without rotating.

The hollow formed centrally of the spin motor 1 (i.e. hollow 2a of rotor 2) is equal in size to, or larger than, a circle described by edges remotest from the spin center J of the wafer W spun as supported by the holders 10. The wafer W supported is spun within a turning circle having a radius corresponding to a distance between the spin center J and the edges remotest from the spin center of the wafer W. As shown in FIG. 6A, for example, the turning circle corresponds to the circumference of the circular wafer W such as a semiconductor wafer when the wafer W is spun about the spin center CJ. As shown in FIG. 6B, the turning circle corresponds to a circle shown in a dot-and-dash line when a rectangular substrate W such as a glass substrate for a liquid crystal display is spun about the spin center CJ. In this embodiment, the rotor 2 and stator 3 are constructed such that the hollow formed centrally of the spin motor 1 is equal in size to, or larger than, the turning circle.

The surfaces of rotor 2 (including the surfaces of projection 2b), the surfaces of stator 3 (including the surfaces of recess 3a) and the surfaces of holders 10 are coated with a material resistive to chemicals, such as silicon carbide (SiC) or a fluororesin. Thus, these components are protected from corrosion and the like by a chemical solution used to clean the wafer W.

Nozzles 21 and 22 are arranged above and below the wafer W supported by the holders 10, for spraying a cleaning liquid such as a chemical solution or deionized water toward the upper and lower surfaces of wafer W. The nozzle 21 above the wafer W is movable by a moving mechanism, not shown, between an operative position (the position shown in solid lines in FIG. 1) over the center (i.e. spin center J) of the upper surface (usually the obverse surface) of wafer W, and a retracted position (the position shown in a two-dot-and-dash line in FIG. 1) outside the circumference of wafer W.

The nozzles 22 below the wafer W are fixed for spraying the cleaning liquid toward the center of the lower surface (usually the reverse surface) of wafer W.

An operation of the apparatus having the above construction will be described next.

When a wafer W to be treated is supported by the holders 10, the nozzle 21 is moved from the retracted position to the operative position. The gas is supplied to the space 8 between the stator 3 and rotor 2. The rotor 2 is spun relative to the stator 3. The wafer W supported is spun about the spin center J. The cleaning liquid is sprayed from the nozzles 21 and 22 to clean the opposite surfaces of wafer W. In an apparatus for cleaning with a chemical solution, the chemical solution is first sprayed from the nozzles 21 and 22 to the opposite surfaces of wafer W. Next, deionized water is sprayed from the nozzles 21 and 22 to the opposite surfaces of wafer W to rinse the wafer W. i.e. to wash away the chemical solution. In an apparatus for cleaning only with deionized water, the deionized water is sprayed from the nozzles 21 and 22 to the opposite surfaces of wafer W.

Upon lapse of a predetermined cleaning time, the supply of the cleaning liquid from the nozzles 21 and 22 is stopped. The spin of wafer W is continued to scatter the cleaning liquid from the wafer W to dry the wafer W.

Upon lapse of a predetermined drying time from the stopping of the cleaning liquid supply from the nozzles 21 and 22, and when the wafer W has been dried, the rotor 2 is stopped spinning relative to the stator 3. The nozzle 21 is moved from the operative position to the retracted position. The cleaned wafer W is released by the holders 10, and transported out of the apparatus.

The apparatus in the first embodiment described above includes no obstacle above the wafer W supported. Thus, the upper surface (usually the obverse surface) of wafer W is cleaned without a hitch. In the first embodiment, the hollow (hollow 2a of rotor 2) is formed centrally of the spin motor 1, and neither the rotary shaft nor the spin base provided in the conventional apparatus is disposed below the wafer W. Thus, as shown in FIG. 1, the lower surface (usually the reverse surface) of wafer W may be cleaned without a hitch through the hollow of spin motor 1.

Further, in the apparatus in the first embodiment, the hollow of spin motor 1 is equal in size to, or larger than, the turning circle of wafer W (see FIGS. 6A and 6B). This construction allows the entire area of the lower surface of wafer W to be cleaned with facility.

In a cleaning operation using a brush, for example, a cleaning liquid usually is supplied to the wafer W in a spin. The entire surface of wafer W is cleaned by reciprocating the rotating brush radially between the spin center and edges of wafer W, with fibers of the brush contacting or slightly lifted from the surface. The apparatus in the first embodiment is capable of effecting such cleaning operation with the brush for the lower surface as well as upper surface of wafer W without a hitch.

The apparatus in the first embodiment is also capable of ultrasonic cleaning of the opposite surfaces of wafer W. In this type of cleaning, an ultrasonic nozzle is reciprocated radially between the spin center and edges of wafer W in a spin. A cleaning liquid with an ultrasonic wave applied thereto is sprayed to the spinning wafer W to clean the entire surfaces of wafer.

As shown in FIG. 7, the hollow of spin motor 1 may be smaller than the turning circle of wafer W (FIGS. 6A and 6B). In this case, as shown in solid lines in FIG. 7, the positions of nozzles 22 may be adjusted so that the cleaning solution supplied from the nozzles 22 may not interfere with the rotor 2. Alternatively, as shown in a two-dot-and-dash line in FIG. 7, a nozzle 22 may be disposed for directing the cleaning solution vertically at the spin center of the lower surface of wafer W.

The spin motor 1 in the foregoing embodiment has the stator 3 disposed outside and coaxially with the rotor 2. Conversely, the spin motor 1 may have a rotor 2 disposed outside and coaxially with the stator 3. However, where the rotor 2 is disposed outside the stator 3, the rotor 2 tends to be larger than the stator 3, and may not receive a sufficient torque for its spin. It is then difficult to achieve a high-speed spin of the rotor 2 (and of wafer W). Therefore, the spin motor 1 should desirably be constructed as in the first embodiment, with the stator 3 disposed outside and coaxially with the rotor 2.

Figure 8:
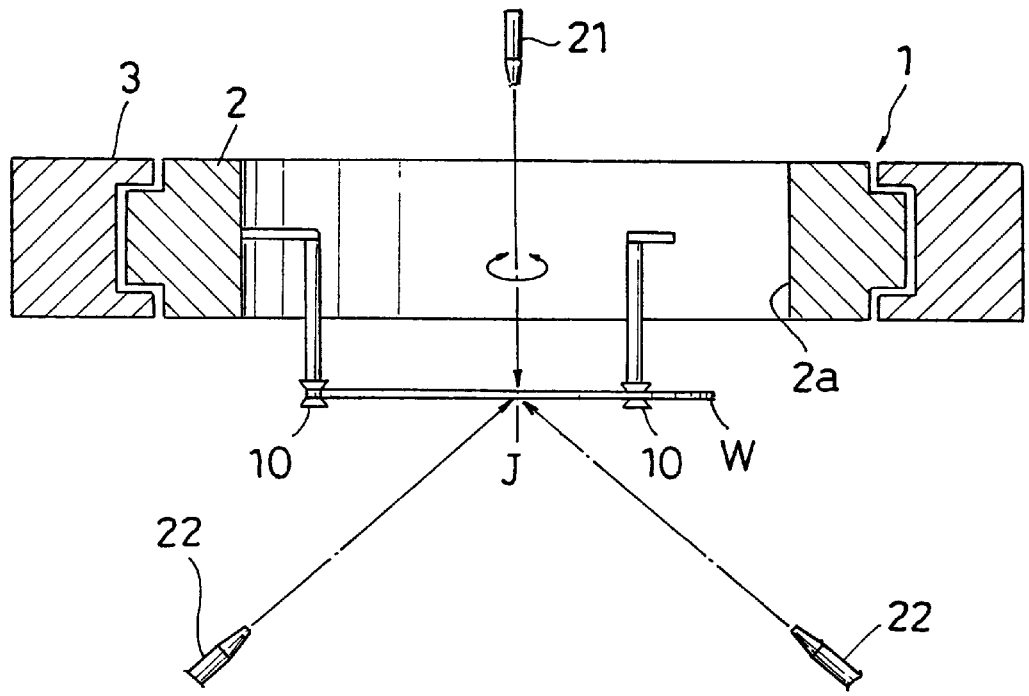
FIG. 8 is view showing a modification in which a substrate is supported under a spin motor.

In the first embodiment, the wafer W is supported over the spin motor 1. However, as shown in FIG. 8, the wafer W may be supported under the spin motor 1.

Further, the rotor 2 and stator 3 of spin motor 1 serve the purpose only if they have hollows opening centrally thereof, and therefore the rotor 2 and stator 3 may be formed cylindrical. However, cylindrical rotor 2 and stator 3 constituting the spin motor 1 would make it difficult to clean the surface of wafer opposed to the spin motor 1 by spraying a cleaning liquid through the hollow formed centrally of spin motor 1. It is therefore preferable that, as in the first embodiment, the rotor 2 and stator 3 are in the form of thin rings. The spin motor 1 formed of thin ring-shaped rotor 2 and stator 3 is thin, and the substrate treating apparatus employing such thin spin motor 1 has a reduced height. This provides an increased freedom in the vertical direction of the apparatus, so that, for example, a plurality of apparatus may be stacked one upon another.

Figure 9:
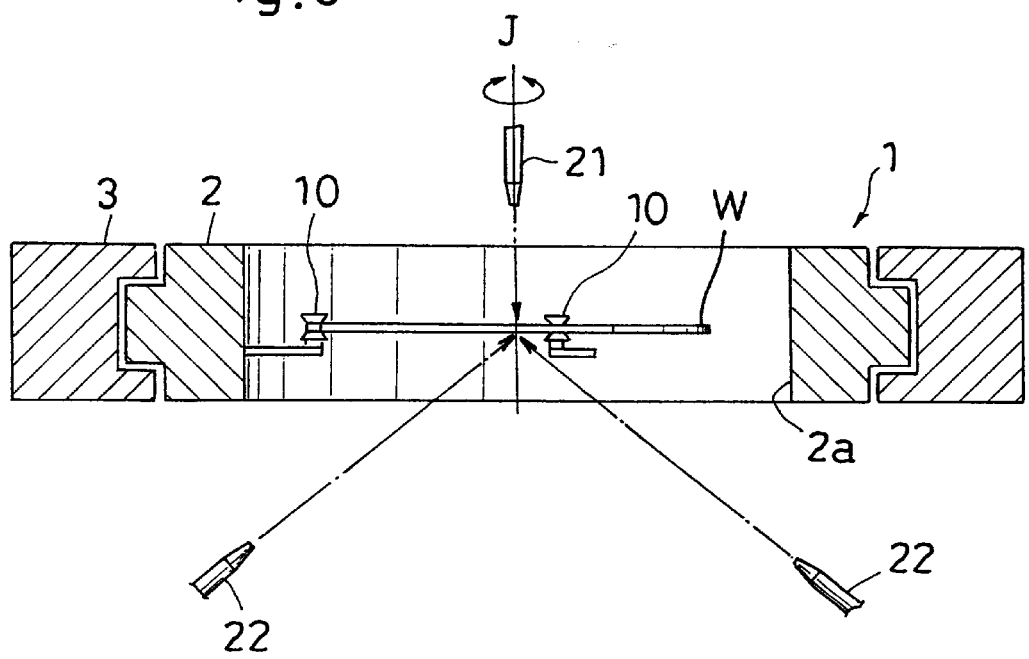
FIG. 9 is a view showing a modification in which a substrate is supported inside a hollow of a spin motor.

As shown in FIG. 9, a spin motor 1 may include a rotor 2 disposed inside a stator 3, the hollow of spin motor 1 being larger than the turning circle wafer W (FIGS. 6A and 6B), with holders 10 attached to inner peripheral surfaces of rotor 2. This construction allows wafer W to be supported inside the hollow of spin motor 1 (hollow 2a of rotor 2). In this construction also, areas over and under the wafer W in the supported position are opened to enable cleaning of the upper and lower surfaces of wafer W. This substrate treating apparatus has a still less height than the substrate treating apparatus constructed to support wafer W over or under the spin motor 1.

Second Embodiment

A second embodiment of this invention will be described with reference to FIGS. 10 through 15.

Figure 10:
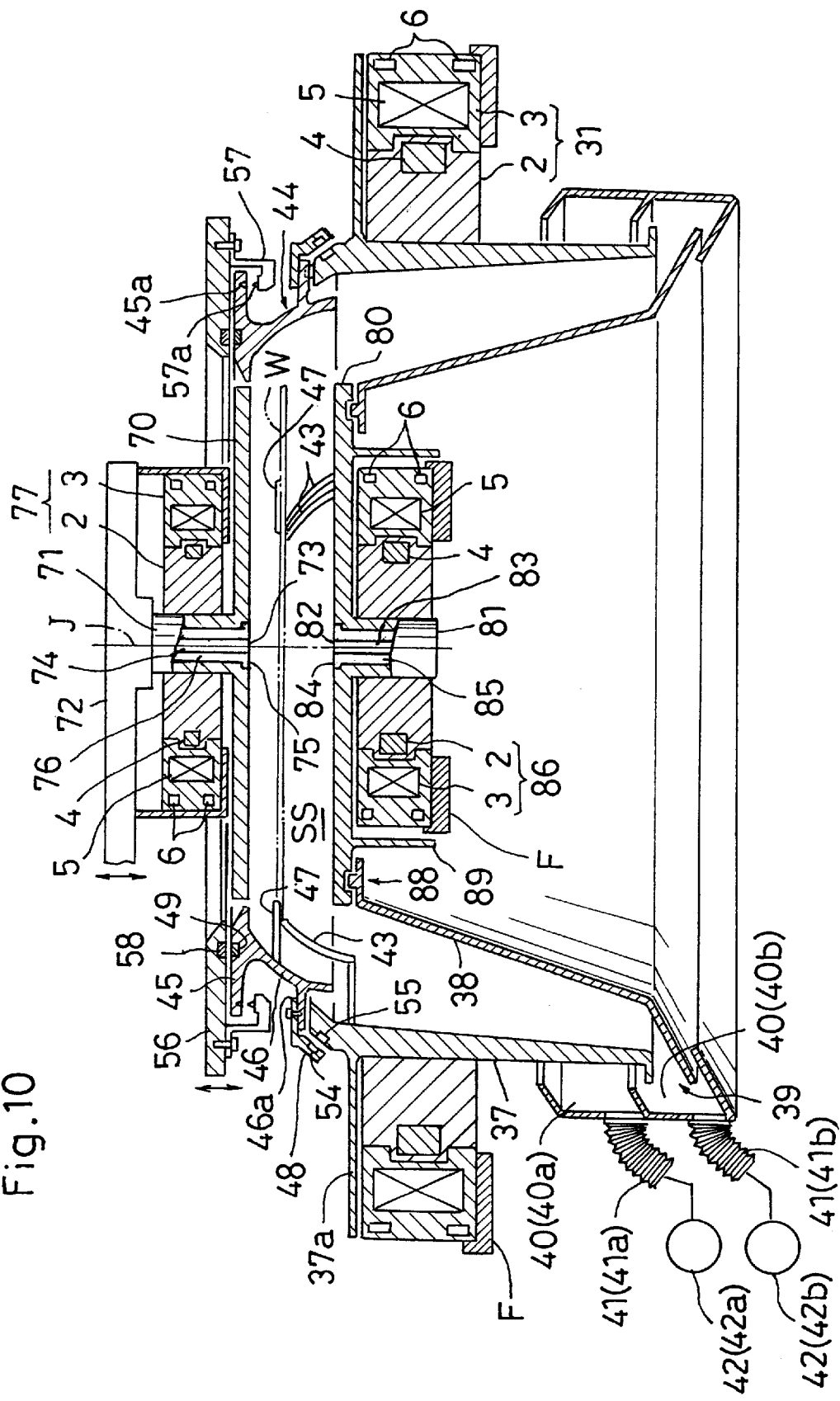
FIG. 10 is a view in vertical section of a substrate treating apparatus in a second embodiment of the invention.

Referring to FIG. 10, a first spin motor 31 for spinning wafer W supported in horizontal posture about a vertical axis J has the same construction as the spin motor 1 described in the first embodiment. Like parts are labeled with like reference numerals with respect to FIG. 1, and will not be described again.

A first lower cover 37 having an approximately cylindrical shape is disposed in the hollow of the first spin motor 31. The first lower cover 37 has an outer peripheral surface thereof connected to the inner peripheral surface of the rotor 2 of the first spin motor 31. Thus, the first spin motor 31 causes the first lower cover 37 to spin with the rotor 2 about the axis J. The first lower cover 37 has a flange 37a extending from the outer peripheral surface thereof to cover an upper surface of the first spin motor 31.

A second lower cover 38 having an approximately cylindrical shape diverging downward is disposed in and opposed to the inner peripheral surface of the first lower cover 37. An annular space is formed between the lower end of the first lower cover 37 and the lower end of the second lower cover 38 to act as a waste liquid outlet 39. Annular waste liquid collecting passages 40 (40a, 40b) are arranged vertically in multiple stages (two stages in FIG. 10) opposite the waste liquid outlet 39 to receive waste liquids exhausted from the waste liquid outlet 39. An end of a waste liquid drain 41 (41a or 41b) is connected to each waste liquid collecting passage 40. The other end of the waste liquid drain 41 (41a or 41b) is connected to a waste liquid collecting tank 42 (42a or 42b). The waste liquids flowing into the waste liquid drains 40a and 40b are collected in the respective waste liquid collecting tanks 42a and 42b. The waste liquid collecting passages 40 (40a, 40b) are vertically movable by a lift mechanism not shown, to be selectively movable to the position opposed to the waste liquid outlet 39 to receive the waste liquids exhausted therefrom. Where, for example, plural types of treating solution are used for substrate treatment, this construction allows the different solutions to be collected separately. Where the treating solutions are not to be collected separately, only one waste liquid collecting passage 40 may be adequate. A suction mechanism, not shown, is connected to the waste liquid drains 41 (41a, 41b) for forcibly exhausting gases from a substrate treating space SS, described hereinafter, through the waste liquid drains 41 (41a, 41b), waste liquid collecting passages 40 (40a, 40b) and waste liquid outlet 39.

Figure 11:
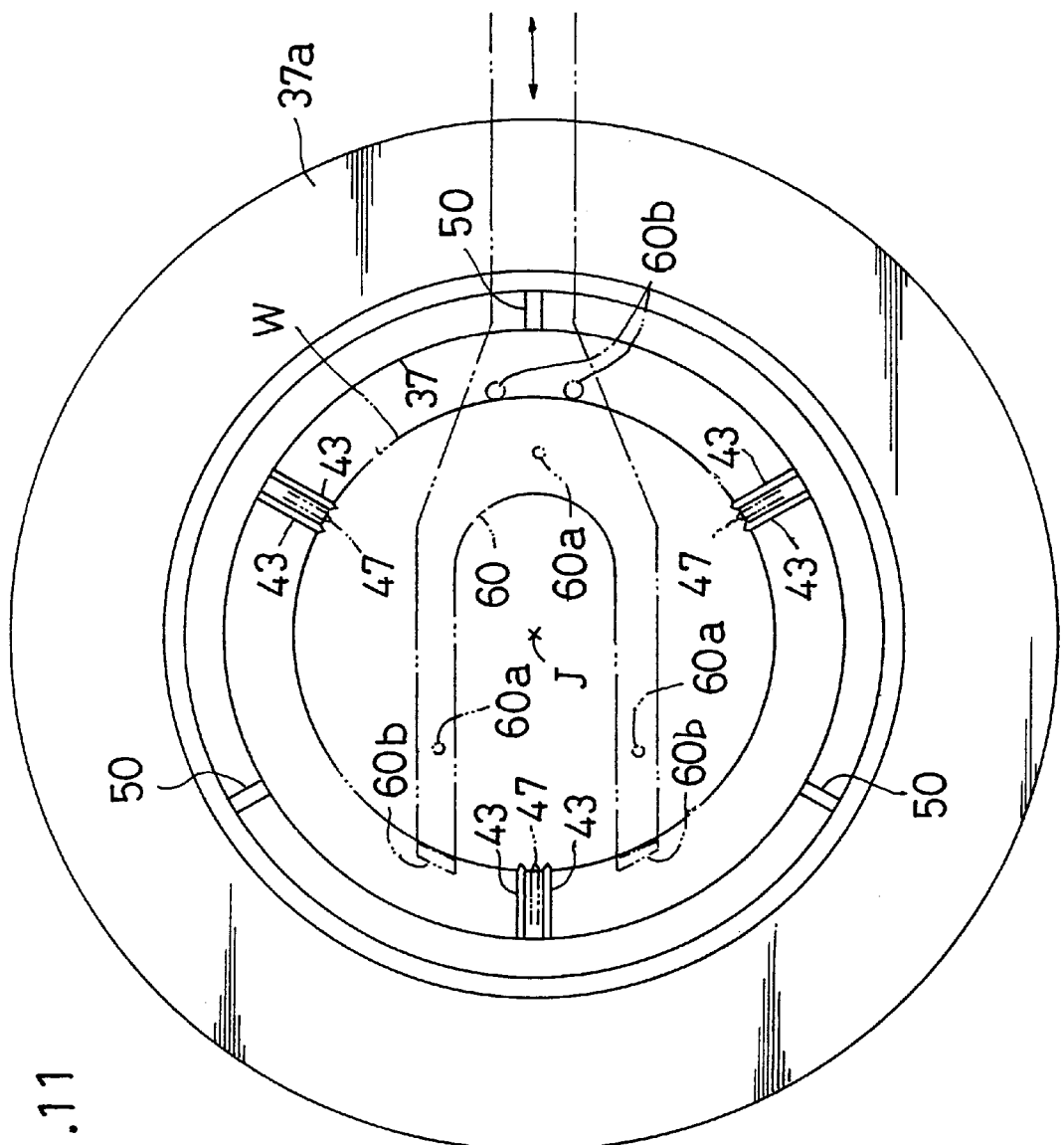
FIG. 11 is a plan view showing positional relations among a first lower cover, lower lugs and upper lugs.

The first lower cover 37 corresponds to the base of lower lugs and the lower guide member of this invention. As shown in FIGS. 10 and 11, the first lower cover 37 includes a pair of right and left lower lugs 43 projecting inward and upward (toward the wafer W) from each of a plurality of supporting positions (three positions arranged at intervals of 120° in FIG. 11) on the inner peripheral surface of the first lower cover 37, to support the wafer W above the first spinning motor 31 and the first lower cover 37. As shown in FIGS. 12A and 12C, each lower lug 43 has a distal end thereof defining a support portion 43a for providing obliquely upward support for an edge of wafer W, and a horizontal restrictor 43b for contacting a side face of the edge of wafer W to determine a horizontal position of wafer W. As illustrated, the support portion 43a and horizontal restrictor 43b preferably have edged configurations to make a point contact (or line contact) with the edge of wafer W. This construction facilitates purging of the treating solution from where each lower lug 43 supports the edge of wafer W. The support portion 43a supports the edge of wafer W in an obliquely lower position without extending under the lower surface (usually the reverse surface) of wafer W. Thus, the lower surface of wafer W may be treated effectively without obstruction. The horizontal restrictor 43b may be formed on an upper lug described hereinafter, instead of the lower lug 43.

An upper gripper 44 is disposed above the first lower cover 37. The upper gripper 44 includes an upper gripping ring 45, and an approximately cylindrical upper cover 46 formed integral with the upper gripping ring 45 and diverging downward to act as a base of upper lugs and as an upper guide. The upper cover 46 has upper lugs 47 projecting inward (toward the wafer W) from a plurality of supporting positions (three positions arranged at intervals of 120°) on the inner peripheral surface thereof. The upper gripper 44 further includes an approximately cylindrical magnet base 48 diverging downward, which is screwed to a flange 46a formed on the outer peripheral surface of upper cover 46.

The upper gripping ring 45 has permanent magnets 49 embedded in the upper surface throughout the circumference thereof. The upper gripping ring 45 defines engaging recesses 45a in a plural of positions (e.g. six positions at intervals of 60°) in the lower surface thereof for receiving engaging projections 57a of elements 57 screwed to a lift member 56 described hereinafter.

The upper cover 46 is disposed between the first lower cover 37 and lower lugs 43. When the entire gripper 44 is lowered as described hereinafter to hold the wafer W, as shown in FIG. 10, the upper end of the first lower cover 37 enters a space between the lower end of upper cover 46 and the lower end of magnet base 48. The inner peripheral surface of upper cover 46 and the inner peripheral surface of the first lower cover 37 act as a splash guide for receiving and guiding to the waste liquid outlet 39 below, splashes of the treating solution scattering from the edges of wafer W spinning about the vertical axis J, with the treating solution supplied thereto. Thus, the first spin motor 31 is disposed outside the first lower cover 37 and upper cover 46 to be isolated from the substrate treating space SS inside the first lower cover 37 and upper cover 46. The first spin motor 31 is not directly exposed to the treating solution atmosphere in the substrate treating space SS. Therefore, the components of the first spin motor 31 need not have resistivity to chemicals. The first spin motor 31 may be manufactured with ease and at low cost. With the wafer W supported, a small gap is formed between the upper end of the first lower cover 37 and the lower end of upper gripper 44. However, as shown in FIG. 10, the upper end of the first lower cover 37 enters the space between the lower end of upper cover 46 and the lower end of magnet base 48 to form a labyrinth seal for checking leakage of mist of the treating solution. Even if mist of the treating solution leaks from that region, an inconvenience such as corrosion of the first spin motor 31 by the treating solution (chemical solution) is avoided since the upper surface of the first spin motor 31 is covered by the flange 37a formed on the outer peripheral surface of the first lower cover 37. The substrate treating space SS is surrounded by the upper cover 46, first lower cover 37, second lower cover 38, an upper atmosphere shield 70 described hereinafter, and a lower atmosphere shield 80 also described hereinafter. These components defining the substrate treating space SS have surfaces with resistivity to chemicals. The lower lugs 43 and upper lugs 47 arranged in the substrate treating space SS are formed of a material resistive to chemicals.

Each upper lug 47 is opposed to a middle position between the pair of right and left lower lugs 43. As shown in FIGS. 12B and 12C, each upper lug 47 has a distal end thereof defining a grip portion 47a for pressing obliquely downward on an edge of wafer W. The wafer W takes a supported posture with a plurality of peripheral positions thereof gripped by the support portions 43a of lower lugs 43 and the grip portions 47a of upper lugs 47, and the horizontal position of wafer W determined by the horizontal restrictors 43b. A substrate holding force for the support portions 43a of lower lugs 43 and the grip portions 47a of upper lugs 47 to grip the edges of wafer W is derived from the weight of the entire upper gripper 44 and the forces of attraction and repulsion of magnets described hereinafter. As do the support portions 43a and horizontal restrictors 43b, the grip portion 47a of each upper lug 47, as illustrated, preferably has an edged configuration to make a point contact (or line contact) with the edge of wafer W. This construction facilitates purging of the treating solution from where each upper lug 47 supports the edge of wafer W. The grip portion 47a grips the edge of wafer W in an obliquely upper position without extending over the upper surface (usually the obverse surface) of wafer W. Thus, the upper surface of wafer W may be treated effectively without obstruction. In FIG. 11, one upper lug 47 is provided for each supporting position. As shown in FIG. 13, a plurality of upper lugs 47 may be provided for each supporting position, e.g. a pair of right and left upper lugs 47, as are the lower lugs 43. When a notched wafer W is supported, as shown in FIG. 13, a notch N may register with either one of lower lug 43 and upper lug 47. However, with this construction, the remaining lugs vertically grip the wafer W. Thus, the notched wafer W also is supported reliably.

Figure 14:
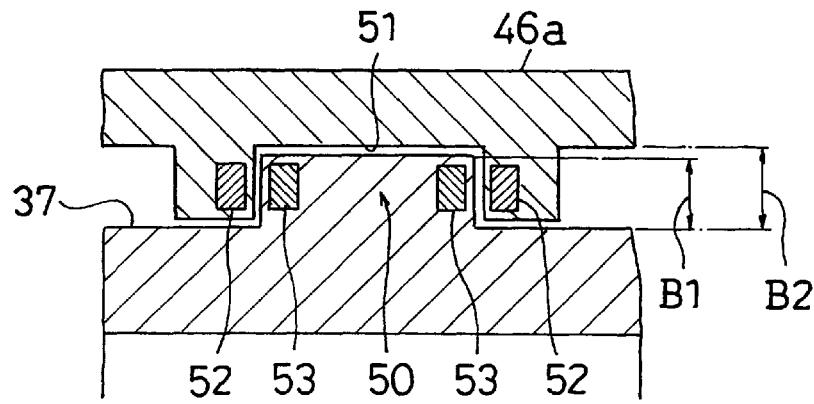
FIG. 14 is a fragmentary view in vertical section of a construction for engaging the first lower cover and an upper grip.

On the upper surface of the first lower cover 37 opposed to the lower surface of the flange 46a formed on the outer peripheral surface of upper cover 46, projections 50 are formed in a plurality of positions (three positions at intervals of 120° in FIG. 11). As shown in FIG. 14, the lower surface of flange 46a formed on the outer peripheral surface of upper cover 46 defines recesses 51 in a plurality of positions (three positions at intervals of 120°) opposed to the projections 50, respectively. In the substrate supporting state, each opposed pair of projection 50 and recess 51 engage each other.

With this construction, when the first spin motor 31 is operated to revolve the lower lugs 43 with the first lower cover 37 about the axis J, thereby spinning the wafer W about the axis J, the entire upper gripper 44 reliably spins about the axis J, following the first lower cover 37 and lower lugs 43. In particular, even when a discrepancy in speed occurs, due to inertia, between the first lower cover 37 and lower lugs 43 and the upper gripper 44 during an acceleration or deceleration of wafer spin, the upper gripper 44 constantly spins with the first lower cover 37 and lower lugs 43 through the engagement between the first lower cover 37 and upper gripper 44. Thus, there occurs no abrasion between the wafer W and the lower lugs 43 and upper lugs 47 holding the wafer W, to preclude any possibility of damage to the wafer W and generation of particles.

As shown in FIG. 14, each projection 50 loosely engages the recess 51 opposed thereto when the upper gripper 44 is lowered and stopped to place the upper lugs 47 in contact with the wafer W, thereby holding the wafer W with the lower lugs 43. At this time, a slight space is formed between the lower surface of flange 46a and the upper surface of the first lower cover 37. The projection 50 has a proximal end and an upper end thereof spaced by a distance B1 which is smaller than a distance B2 between the proximal end of projection 50 and the bottom of recess 51. As a result, the upper end of projection 50 constantly remains out of contact with the bottom of recess opposed thereto. As shown in FIG. 14, magnets 52 and 53 are embedded in an outer peripheral surface of projection 50 and an inner peripheral surface of recess 51 opposed to each other. When the projection 50 and recess 51 forming a pair are engaged, the outer peripheral surface of projection 50 and the inner peripheral surface of recess 51 repel each other. With this construction, when the recess 51 and projection 50 are engaged, the outer peripheral surface of projection 50 and the inner peripheral surface of recess 51 remain out of contact, to check generation of particles due to an abrasion therebetween. The outer peripheral surface of projection 50 and the inner peripheral surface of recess 51 may, by inertia, tend to move in a direction to contact each other during an acceleration or deceleration of wafer spin. However, such movement is prevented by the repulsive force of magnets 52 and 53. Thus, the outer peripheral surface of projection 50 and the inner peripheral surface of recess 51 are constantly maintained out of contact with each other during a spin of wafer W, to check generation of particles due to abrasion. In the illustrated example, the projections 50 are formed on the first lower cover 37 and the recesses 51 in the flange 46a. This arrangement may be reversed. Further, the first lower cover 37 may include a mixture of projections 50 and recesses 51 while flange 46a also includes a mixture of projections 50 and recesses 51 for engaging the two components.

The magnet base 48 has permanent magnets 54 embedded in the inner peripheral surface throughout the circumference thereof. The first lower cover 37 has permanent magnets 55 embedded in the outer peripheral surface throughout the circumference thereof to be opposed to the magnets 54. These magnets 54 and 55 have different polarities opposed to each other. In the substrate supporting state, the upper gripper 44 is attracted toward the first lower cover 37 to drawn the upper lugs 37 downward. Thus, a holding force for the lower lugs 43 and upper lugs 47 to hold the wafer W is derived also from these magnets 54 and 55.

The ring-shaped lift member 56 is disposed above the upper gripper 44. The lift member 56 includes L-shaped elements 57 screwed to a plurality of positions (e.g. six positions at intervals of 60° on the lower surface thereof to extend under the lower surface of upper gripping ring 45 of upper gripper 44. Each element 57 has an engaging projection 57a formed at a distal end thereof for engaging one of engaging recesses 45a formed in the lower surface of upper gripping ring 45. The lift member 56 further includes permanent magnets 58 embedded in the lower surface throughout the circumference thereof to be opposed to the permanent magnets 49 embedded in the upper surface of upper gripping ring 45. These magnets 49 and 58 have the same polarity opposed to each other. In the substrate supporting state, therefore, the upper gripper 44 is maintained away from the lift member 56 to bias the upper lugs 47 downward. Thus, a holding force for the lower lugs 43 and upper lugs 47 to hold the wafer W is derived also from these magnets 49 and 58.

Figure 15:
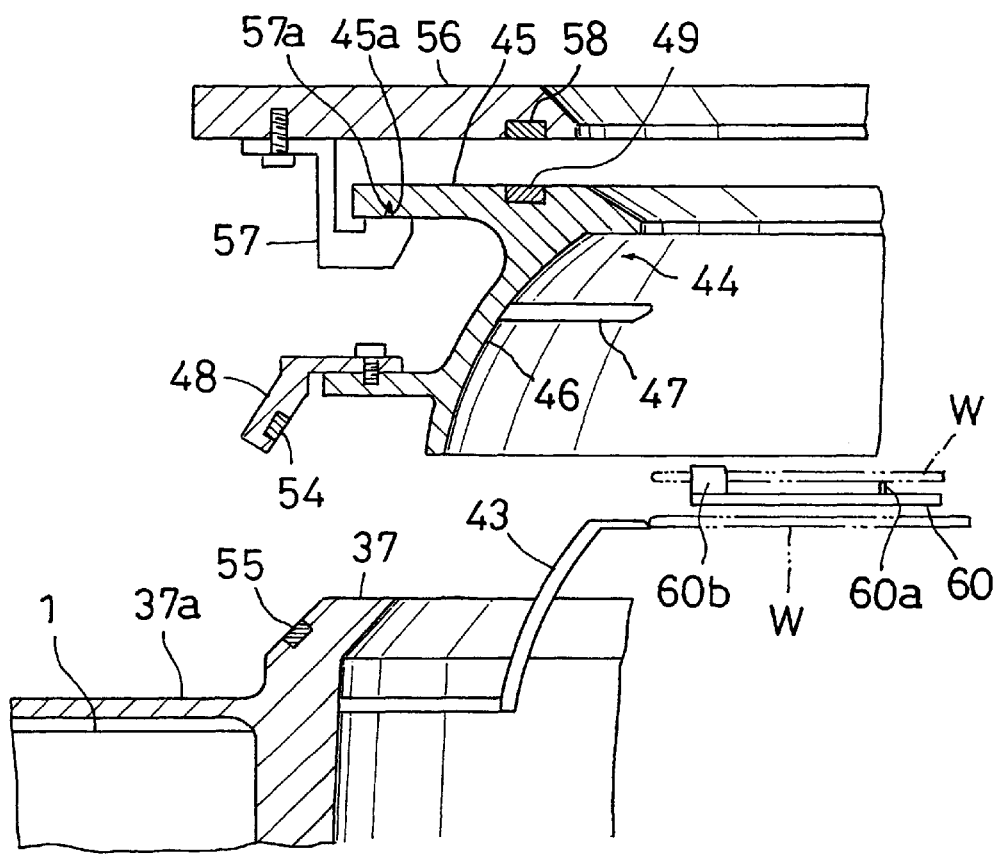
FIG. 15 is a fragmentary view in vertical section showing a retracted state.

The lift member 56 is vertically movable by an actuator such as an air cylinder not shown. When the lift member 56 is raised to a predetermined height, the entire upper gripper 44 is raised, with the recesses 45a and projections 57a engaged with each other. As shown in FIG. 15, each upper lug 47 is retracted from the lower lug 43. In the retracted state, a space is formed between the first lower cover 37 and lower lugs 43 and the upper gripper 44, i.e. between the upper end of first lower cover and the lower end of upper cover 46. Through this space, wafer W is transported into and out of the apparatus, to place the wafer W on or remove it from the lower lugs 43. That is, wafer W to be treated is placed on the lower lugs 43, and treated wafer W is removed from the lower lugs 43. The introduction and removal of wafer W are carried out by a substrate transporting mechanism (not shown) having a substrate support arm 60 which is Y-shaped in plan view as seen in FIGS. 11 and 15, for example. The substrate support arm 60 has a plurality of (three in the drawings) substrate support pins 60a projecting from the upper surface thereof for supporting the lower surface of wafer W through point contact, and a plurality of (four in the drawings) horizontal restrictors 60b for determining horizontal positions of the edges of wafer W. The substrate transport mechanism is operable to move the substrate support arm 60 horizontally and vertically. With a combination of horizontal movement and vertical movement, the wafer W is carried into and out of the apparatus and placed on and removed from the lower lugs 43.

When the lift member 56 is lowered from the retracted position, the upper gripper 44 is lowered. In the course of this descent, the upper lugs 47 contact the edges of wafer W supported on the lower lugs 43, and then the descent of upper gripper 44 is stopped. The lift member 56 is stopped in a position slightly below a stopping height of upper gripper 44. That is, as shown in FIG. 10, the lift member 56 is stopped at a height where the recesses 45a and projections 57a become disengaged, and a slight space is formed between the lower surface of lift member 56 and the upper surface of upper gripping ring 45. In this position, the lift member 56 remains suspended by the actuator. In this substrate supporting state, the holding force of lower lugs 43 and upper lugs 47 for holding the wafer W is derived from the weight of the entire upper gripper 44 and from the magnetic forces including the attraction between magnets 54 and 55 and the repulsion between magnets 49 and 58. In this way, the wafer W is reliably maintained in place. The configurations of the first lower cover 37 and upper gripper 44 and positions of the magnets may appropriately be designed to hold the wafer W based on a repulsion between magnets arranged on the first lower cover 37 and magnets arranged on the upper gripper 44. Two or more sets of magnets may be provided for the first lower cover 37 and upper gripper 44 to hold the wafer W with forces of attraction and repulsion of the magnets.

A disk-shaped upper atmosphere shield 70 is disposed above the wafer W supported by the lower lugs 43 and upper lugs 47. A support shaft 71 coaxial with the axis J is rigidly connected to the upper surface of upper atmosphere shield 70. The support shaft 71 has an upper end thereof connected to a support arm 72 to be rotatable about the axis J. The support arm 72 is vertically movable by an actuator such as an air cylinder not shown. Thus, the upper atmosphere shield 70 is vertically movable through the support arm 72 and support shaft 71. When treating the wafer W, the upper atmosphere shield 70 is moved to a predetermined distance to the upper surface of wafer W. When transporting the wafer W, the upper atmosphere shield 70 is retracted upward. The upper atmosphere shield 70 has a treating solution supply opening 73 formed centrally of the lower surface thereof. The treating solution is supplied from a treating solution supply source not shown, through a treating solution supply passage 74 to the upper surface of wafer W. A gas supply opening 75 is formed around the treating solution supply opening 73 for supplying an inert gas such as nitrogen gas or a gas such as dry air from a gas supply source not shown, through a gas supply passage 76. The gas is supplied to a space between the lower surface of upper atmosphere shield 70 and the upper surface of wafer W lying adjacent thereto. A second spin motor 77 is disposed above the upper atmosphere shield 70. The second spin motor 77 has a similar construction to the spin motor 1 in the first embodiment. A rotor 2 is connected to the support shaft 71 rotatable with the upper atmosphere shield 70 about the axis J. A stator 3 is supported by the support arm 72, for example. The second spin motor 77 is disposed above the upper atmosphere shield 70, and outside the substrate treating space SS. The gases are forcibly exhausted downward from the substrate treating space SS. Thus, mist of the treating solution never flows from the substrate treating space SS upward around the upper atmosphere shield 70. The second spin motor 77 is never exposed to the atmosphere of the treating solution, and therefore need not be resistive to chemicals.

A disk-shaped lower atmosphere shield 80 is disposed adjacent and below the wafer W supported by the lower lugs 43 and upper lugs 47. A shaft 81 coaxial with the axis J is rigidly connected to the lower surface of lower atmosphere shield 80. The lower atmosphere shield 80 has a treating solution supply opening 82 formed centrally of the upper surface thereof. The treating solution is supplied from a treating solution supply source not shown, through a treating solution supply passage 83 to the lower surface of wafer W. A gas supply opening 84 is formed around the treating solution supply opening 83 for supplying an inert gas or dry air from a gas supply source not shown, through a gas supply passage 85. The gas is supplied to a space between the lower surface of lower atmosphere shield 80 and the upper surface of wafer W lying adjacent thereto. A third spin motor 86 is disposed below the lower atmosphere shield 80. The third spin motor 86 has a similar construction to the spin motor 1 in the first embodiment. A rotor 2 is connected to the shaft 81 rotatable with the lower atmosphere shield 80 about the axis J. A stator 3 is supported by the apparatus frame F, for example. The third spin motor 86 may also be adapted vertically movable to vary its spacing from the lower surface of wafer W as appropriate.

The edge of lower atmosphere shield 80 is out of contact with the upper end of second lower cover 38. However, a labyrinth seal mechanism 88 is provided in this region to check leakage of mist of the treating solution from the substrate treating space SS. The lower atmosphere shield 80 further includes a cylindrical cover 89 formed integral with the lower surface thereof and extending around the entire circumference of the outer peripheral surface of the third spin motor 86. Thus, the third spin motor 86 is effectively protected from exposure to the atmosphere of the treating solution. The third spin motor 86 need not be resistive chemicals. The upper end of the second lower cover 38 may be connected to the edge of lower atmosphere shield 80, so that the second lower cover 38 is rotatable with the lower atmosphere shield 80 about the axis J. This construction eliminates the space between the upper end of the second lower cover 38 and the edge of lower atmosphere shield 80.

An operation of the apparatus having the above construction will be described hereinafter.

The upper atmosphere shield 70 is retracted upward, and the lift member 56 is raised to raise the upper gripper 44 to the retracted position. In this state, wafer W to be treated is introduced and placed on the lower lugs 43. Subsequently, the lift member 56 is lowered to hold the wafer W between the lower lugs 43 and upper lugs 47. The upper atmosphere shield 70 is lowered close to the upper surface of wafer W in the supported position. Next, the first to third spin motors 31, 77 and 86 are driven to spin, about the axis J, the wafer W held between the lower lugs 43 and upper lugs 47, the upper atmosphere shield 70 and lower atmosphere shield 80. The treating solution, such as a cleaning solution, is supplied from the treating solution supply openings 73 and 82 to the opposite surfaces of wafer W to effect a predetermined treatment, e.g. cleaning of wafer W. At this time, the gas may be supplied from the gas supply openings 75 and 84 as necessary. Splashes of the treating solution scattering from the edges of spinning wafer W during the treatment are received by the inner peripheral surfaces of upper cover 46 and first lower cover 37. The treating solution is thereby guided downward to the waste liquid outlet 39 to be collected in the waste liquid tank 42. Splashes of the treating solution scattering from the edges of spinning upper atmosphere shield 70 and lower atmosphere shield 80 are also received by the inner peripheral surfaces of upper cover 46 and first lower cover 37, thereby being guided downward to the waste liquid outlet 39 to be collected in the waste liquid tank 42. The lower lugs 43 are driven by the first spin motor 31 to revolve about the axis J, with rotation of the first lower cover 37. These lower lugs 43 are distributed circumferentially, and revolve in the substrate treating space SS, cutting through the gas therein. Since these lower lugs 43 are surrounded by the upper cover 46, the revolution of the lower lugs 43 causes little disturbance of the gas inside the substrate treating space SS, and thus presents no problem.

After a predetermined time of treatment with the treating solution supplied, the supply of the treating solution is stopped and only the spin of wafer W, upper atmosphere shield 70 and lower atmosphere shield 80 is continued. Part of the treating solution adhering to the wafer W is shaken off and the wafer W is dried. During the drying process, the gas may be supplied from the gas supply openings 75 and 84 to speed up the drying of wafer W. Splashes of the treating solution scattering from the edges of spinning wafer W, upper atmosphere shield 70 and lower atmosphere shield 80 during the drying process are also received by the inner peripheral surfaces of upper cover 46 and first lower cover 37, thereby being guided downward to the waste liquid outlet 39 to be collected in the waste liquid tank 42.

After the above drying process is done for a predetermined time, the spin motors 31, 77 and 86 are stopped to terminate the substrate treatment and stop the spin of dried wafer W, upper atmosphere shield 70 and lower atmosphere shield 80. The upper atmosphere shield 70 is retracted upward, and the lift member 56 is raised to raise the upper gripper 44 to the retracted position. The treated wafer W is removed from the lower lugs 43 and transported out of the apparatus. Then, a next wafer W to be treated is introduced for the same treatment as described above. In this way, the same treatment is repeated subsequently.

With no wafer W supported in place, the upper atmosphere shield 70 may be lowered close to the lower atmosphere shield 80, and the cleaning solution may be supplied from the treating solution supply openings 73 and 82 while spinning the upper atmosphere shield 70 and lower atmosphere shield 80. In this way, the lower surface of upper atmosphere shield 70 and the upper surface of lower atmosphere shield 80 may be automatically cleaned. After stopping the supply of the cleaning solution from the treating solution supply openings 73 and 82, the upper atmosphere shield 70 and lower atmosphere shield 80 may be spun. In this way, the upper atmosphere shield 70 and lower atmosphere shield 80 may be dried automatically after the cleaning. If, at this time, the gas is supplied from the gas supply openings 75 and 84, the upper atmosphere shield 70 and lower atmosphere shield 80 may be dried quickly.

Where the lower atmosphere shield 80 is adapted vertically movable, an automatic cleaning of the inner peripheral surface of upper cover 46 is also made possible. That is, the upper atmosphere shield 70 and lower atmosphere shield 80 cleaned as described above are moved close to each other, and the cleaning solution is supplied from the treating solution supply openings 73 and 82 while spinning the upper atmosphere shield 70 and lower atmosphere shield 80. Then, the clean cleaning solution scatters from the edges of upper atmosphere shield 70 and lower atmosphere shield 80 and collides with the inner peripheral surface of upper cover 46, thereby automatically cleaning the latter. The entire inner peripheral surface of upper cover 46 may be cleaned by vertically moving the adjacent upper atmosphere shield 70 and lower atmosphere shield 80 together to vary positions of the upper atmosphere shield 70 and lower atmosphere shield 80 relative to the inner peripheral surface of upper cover 46. After cleaning the inner peripheral surface of upper cover 46, the above cleaning operation may be continued. Then, the clean cleaning solution reaches the inner peripheral surface of the first lower cover 37 through the inner peripheral surface of upper cover 46. In this way, the inner peripheral surface of the first lower cover 37 may also be cleaned automatically. The inner peripheral surface of the first lower cover 37 may automatically be cleaned with enhanced precision where the upper atmosphere shield 70 and lower atmosphere shield 80 adjacent each other are adapted vertically movable inside the inner peripheral surface of the first lower cover 37.

The substrate treating apparatus described in the second embodiment has the spin motors having constructions similar to the spin motor in the first embodiment. Thus, the second embodiment produces the following effects in addition to the effect of the first embodiment.

First, the substrate holding force is derived from the weight and magnetism of upper gripper 44, which dispenses with springs for maintaining the holders in the holding position, and a link mechanism for interlocking the springs to the holders. Thus, the wafer W may be supported by a simple construction. The substrate holding force is strong since it is derived from the magnetism as well as weight of upper gripper 44, whereby the wafer W is supported reliably.

In the substrate treating apparatus described in the second embodiment, switching between engagement and release of the wafer W is effected by vertically moving the upper gripper 44. The apparatus includes no mechanical rotational element or slidable element which are essential elements in the prior art for switching between engagement and release of wafer W. Contamination of wafer W is reduced in the absence of particles generated by a sliding contact between components. The substrate supporting device includes a device which derives the substrate holding force from the weight and magnetism of components of a supporting mechanism, and a device including mechanical slidable elements. In the second embodiment, the force for holding wafer W may be derived only from the weight of upper gripper 44.

According to the apparatus in the second embodiment, the first lower cover 37 and upper cover 46 are arranged in the hollow of the first spin motor 31 to act as the guides. The substrate treating space SS defined therein receives the wafer W for treatment. The wafer W is spun with the first lower cover 37. Thus, the spin motor having a simple construction for spinning the wafer may be protected from exposure to the atmosphere of the treating solution.

In the construction of the second embodiment, the wafer W is transported into and out of the apparatus, and placed on and removed from the lower lugs 43, by advancing and retracting the substrate transport arm 60 of the substrate transport mechanism laterally through the space formed between the upper end of the first lower cover 37 and the lower end of upper cover 46 moved away from each other. Thus, the substrate transport mechanism commonly used in the prior art may be employed in transporting the wafer W into and out of the apparatus, and placing and removing the wafer W on/from the lower lugs 43.

Figure 16:
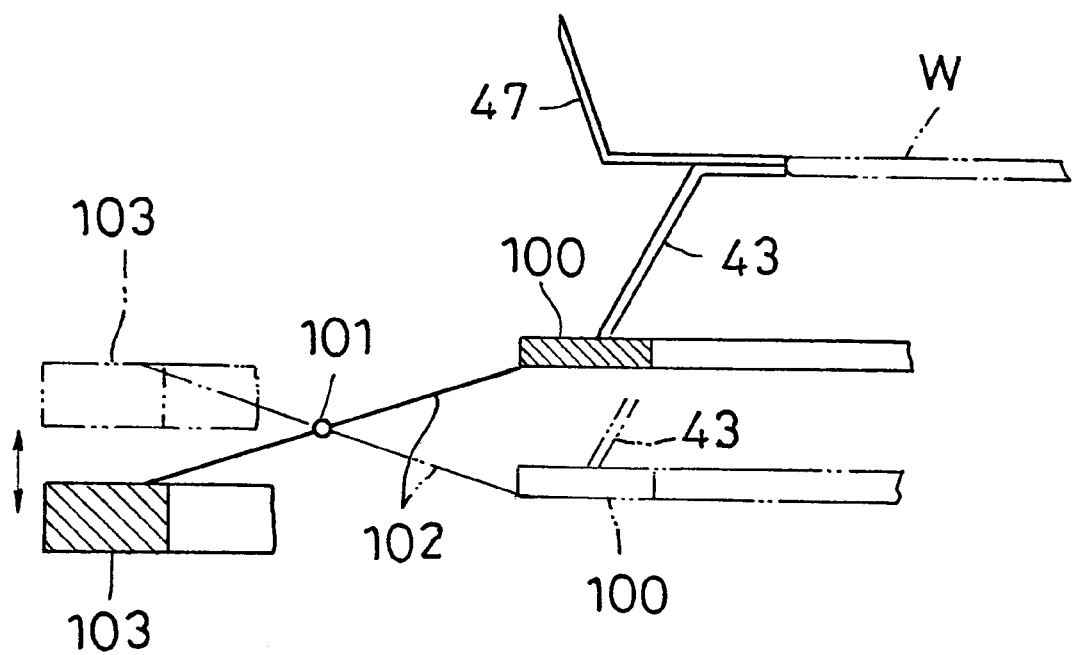
FIG. 16 is a fragmentary front view showing a principle of obtaining a substrate holding force by a weight of components of a holding mechanism when the lower lugs are moved vertically.

In the second embodiment, the upper lugs 47 are vertically moved to switch between the holding position and the retracted position. This relationship may be reversed, that is the lower lugs 43 may be vertically moved relative to the upper lugs 47 to switch between the holding position and the retracted position. In this case, the lower lugs 43 are raised close to the upper lugs 47 to assume the holding position. The substrate holding force based on the weight of the components of the support mechanism may, in principle, be derived from a construction as shown in FIG. 16, for example. In FIG. 16, lower lugs 43 projects from a ring-shaped lower lug base 100 which is connected to a ring-shaped lift member 103 through a swing member 102 pivotable about a horizontal axis 101. When, as shown in two-dot-and-dash lines in FIG. 16, the lift member 103 is raised by an actuator such as an air cylinder not shown, the lower lugs 43 are lowered, with the lower lug base 100, to a retracted position away from the upper lugs 47. When the raised lift member 103 is allowed to descend, as shown in solid lines in FIG. 16, the lower lugs 43 are raised, with the lower lug base 100, to a holding position adjacent the upper lugs 47. In the holding position, the weight of lift member 103 imparts a force in a direction to press the lower lugs 43 against the upper lugs 47. This force corresponds to the part of the substrate holding force based on the weight of components of the supporting mechanism.

The second embodiment exemplifies a treating apparatus with the upper atmosphere shield 70. Without using the upper atmosphere shield 70, the treating solution may be supplied from a nozzle to the upper surface of wafer W supported to treat the upper surface of wafer W, or a cleaning tool such as a cleaning brush may be caused to act on the upper surface of wafer W to effect cleaning treatment. Similarly, the lower surface of wafer W may be treated without using the lower atmosphere shield 80.

The first and second embodiments exemplify treatment of circular substrates. This invention is applicable also to treatment of rectangular substrates such as glass substrates for photomasks or glass substrates for liquid crystal displays.

The construction of the holders, and engagement and release of wafer W by the holders, are not limited to what is shown in the first and second embodiments.

The first and second embodiments exemplify cleaning treatment of wafer W. This invention provides a simple construction also for what is known as spin coating in which a resist solution is applied to the surface of spinning wafer W to form a resist layer thereon, and for what is known as back rinsing in which deionized water or the like is supplied to the back of wafer W to prevent mist of the resist solution flowing around to the back of wafer W to adhere thereto.

This invention may be applied to apparatus for performing other types of substrate treatment.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate spin treating apparatus, comprising:
    (A) a spin motor including:
        (1) a rotor having a hollow central opening; and
        (2) a stator disposed coaxially with said rotor and having a hollow central opening, said rotor and stator interact magnetically to cause rotational movement of said rotor;
    (B) a substrate support mounted on said rotor for supporting a substrate; and
    (C) a treating solution applicator for applying a treating solution to a substrate supported by said substrate support.

2. A substrate spin treating apparatus as defined in claim 1, wherein said rotor is supported by said stator through a static pressure gas bearing.

3. A substrate spin treating apparatus as defined in claim 1, wherein said stator is disposed radially outside of said rotor.

4. A substrate spin treating apparatus as defined in claim 1, wherein said substrate support comprises a holder for holding said substrate in horizontal posture, said holder holding said substrate at a plurality of peripheral positions thereof, and a support mechanism for moving said holder between a holding position for holding said substrate and a retracted position removed from said substrate.

5. A substrate treating apparatus as defined in claim 4, wherein said support mechanism holds said substrate in place as a function of the weight of components of said support mechanism and the magnetism of other components thereof.

6. A substrate spin treating apparatus as defined in claim 4, wherein said holder means includes lower lugs for contacting edges of said substrate from below, and upper lugs for contacting the edges of said substrate from above, at least one of a proximal end of each of said lower lugs and a proximal end of each of said upper lugs being connected to said rotor, said support mechanism being operable to move said lower lugs and said upper lugs away from each other to assume said retracted position, and towards each other to assume said holding position.

7. A substrate spin treating apparatus as defined in claim 6, wherein said support mechanism is operable to move said lower lugs and said upper lugs towards each other by a weight and magnetism of components of said support mechanism.

8. A substrate spin treating apparatus as defined in claim 7, wherein said proximal end of each of said lower lugs and said proximal end of each of said upper lugs have substrate holding magnets, said substrate holding magnets, in said holding position, imparting attractive forces and/or repulsive forces to move said lower lugs and said upper lugs towards each other.

9. A substrate spin treating apparatus as defined in claim 7, wherein said proximal end of each of said lower lugs has a recess and/or a projection, and said proximal end of each of said upper lugs has a projection and/or a recess for engaging said recess and/or said projection of said proximal end of each of said lower lugs in said holding position.

10. A substrate spin treating apparatus as defined in claim 9, wherein said recesses and said projections engageable in said holding position are in a vertical position and are loosely engageable, said recesses having recess magnets arranged on inner peripheral surfaces thereof, and said projections having projection magnets arranged on outer peripheral surfaces thereof, such that, when said recesses and said projections are loosely engaged, said inner peripheral surfaces of said recesses and said outer peripheral surfaces of said projections repulse each other.

11. A substrate spin treating apparatus as defined in claim 6, wherein a plurality of upper lugs and a plurality of lower lugs are juxtaposed for supporting said substrate in each peripheral position.

12. A substrate spin treating apparatus as defined in claim 6, wherein each of said upper lugs and each of said lower lugs have edged distal ends, respectively.

13. A substrate spin treating apparatus as defined in claim 4, further comprising:
a treating solution guide for guiding splashes of said treating treatment solution applied to and scattering from said substrate during treatment, to a waste liquid outlet;
said holder including lower lugs for contacting edges of said substrate from below, and upper lugs for contacting the edges of said substrate from above;
said support mechanism being operable to move said lower lugs and said upper lugs away from each other to assume said retracted position, and towards each other to assume said holding position;
said treating solution guide being disposed in a hollow of said spin motor and connector to said rotor;
said lower lugs and said upper lugs being arranged in a substrate treating space formed inwardly of said guide, and said lower lugs and said upper lugs being arranged on said guide.

14. A substrate spin treating apparatus as defined in claim 13, wherein:
said treating solution guide includes a lower guide member and an upper guide member,
said lower lugs being arranged on said lower guide member, and said upper lugs being arranged on said upper guide member;
one of said lower guide member and said upper guide member being connected to said rotor; and the other guide member being vertically movable toward and away from said one guide member connected to said rotor;
said lower lugs and said upper lugs holding said substrate in peripheral positions thereof above an upper end or below a lower end of said one guide member connected to said rotor.

15. A substrate spin treating apparatus as defined in claim 14, wherein said upper guide member has a lower end thereof extending circumferentially of said lower lugs when said lower guide member and said upper guide member are placed adjacent each other.

16. A substrate spin treating apparatus as defined in claim 1, wherein said substrate support is adapted to support a substrate in an area which is within an imaginary cylinder which is both coaxial with and has a diameter equal to that of an inner diameter of said hollow central opening of said rotor.

17. A substrate spin treating apparatus as defined in claim 1, wherein said treating solution applicator applies a cleaning solution to a substrate supported by said substrate support.

18. A substrate spin treating apparatus as defined in claim 5, wherein said support mechanism is operable to move said holder away from said peripheral positions of said substrate to assume said retracted position and towards said peripheral positions of said substrate to assume said holding position as a function of said weight of said components of said support mechanism and as a function of said magnetism of other components thereof.

19. A substrate spin treating apparatus as defined in claim 1, wherein said stator and rotor have approximately the same height as measured in a direction parallel to an axis of rotation of said rotor.

* * * * *